(12) United States Patent
Iizuka et al.

(10) Patent No.: US 8,120,046 B2
(45) Date of Patent: Feb. 21, 2012

(54) LIGHT-EMITTING ELEMENT

(75) Inventors: Kazuyuki Iizuka, Hitachi (JP); Masahiro Arai, Hitachi (JP)

(73) Assignee: Hitachi Cable, Ltd., Tokyo (JP)

( * ) Notice: Subject to any disclaimer, the term of this patent is extended or adjusted under 35 U.S.C. 154(b) by 127 days.

(21) Appl. No.: 12/585,827

(22) Filed: Sep. 25, 2009

(65) Prior Publication Data

US 2010/0078659 A1   Apr. 1, 2010

(30) Foreign Application Priority Data

Sep. 29, 2008 (JP) ................. 2008-249673

(51) Int. Cl.
*H01L 33/00* (2010.01)
(52) U.S. Cl. ............... 257/94; 257/98; 257/96; 257/79; 257/13; 257/103; 257/22; 257/76; 257/E33.005; 257/E33.067
(58) Field of Classification Search .............. 257/64, 257/68 E33.005, 94, 98; 357/94, 98, 96, 357/79, 13, 103, 22, 76, E33.005, E33.067
See application file for complete search history.

(56) References Cited

U.S. PATENT DOCUMENTS

| | | | |
|---|---|---|---|
| 6,869,820 B2 * | 3/2005 | Chen | ............. 438/79 |
| 6,987,287 B2 | 1/2006 | Liu et al. | |
| 7,087,933 B2 | 8/2006 | Takeda et al. | |
| 2004/0104393 A1 | 6/2004 | Liu et al. | |
| 2005/0110037 A1 * | 5/2005 | Takeda et al. | ............. 257/103 |

FOREIGN PATENT DOCUMENTS

| JP | 2004-253763 | 9/2004 |
|---|---|---|
| JP | 2005-175462 | 6/2005 |

* cited by examiner

*Primary Examiner* — Junghwa M Im
(74) *Attorney, Agent, or Firm* — McGinn IP Law Group, PLLC

(57) ABSTRACT

A light-emitting element includes a semiconductor laminated structure including a first semiconductor layer of a first conductivity type, a second semiconductor layer of a second conductivity type different from the first conductivity type and an active layer sandwiched by the first and second semiconductor layers, a first electrode on one surface side of the semiconductor laminated structure, a conductive reflective layer on an other surface side of the semiconductor laminated structure for reflecting light emitted from the active layer, a contact portion partially formed between the semiconductor laminated structure and the conductive reflective layer and being in ohmic contact with the semiconductor laminated structure, and a second electrode on a part of a surface of the conductive reflective layer on the semiconductor laminated structure without contacting the semiconductor laminated structure for feeding current to the contact portion.

2 Claims, 17 Drawing Sheets

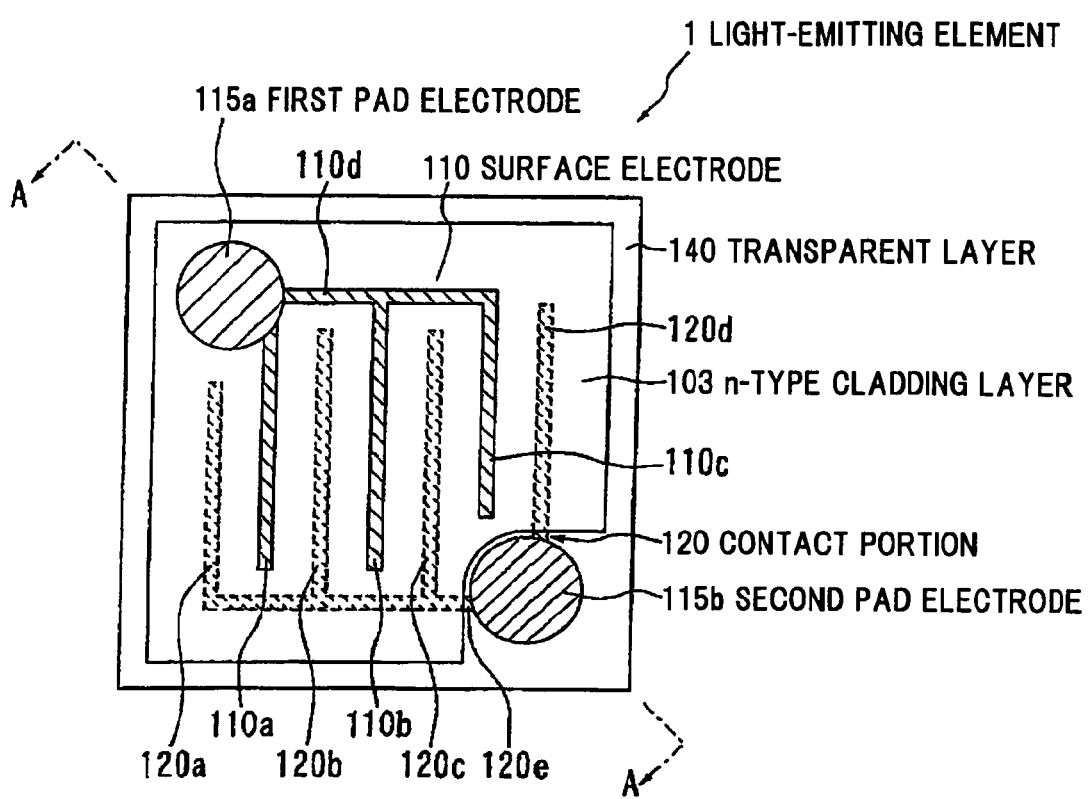

11 SEMICONDUCTOR LAMINATED STRUCTURE

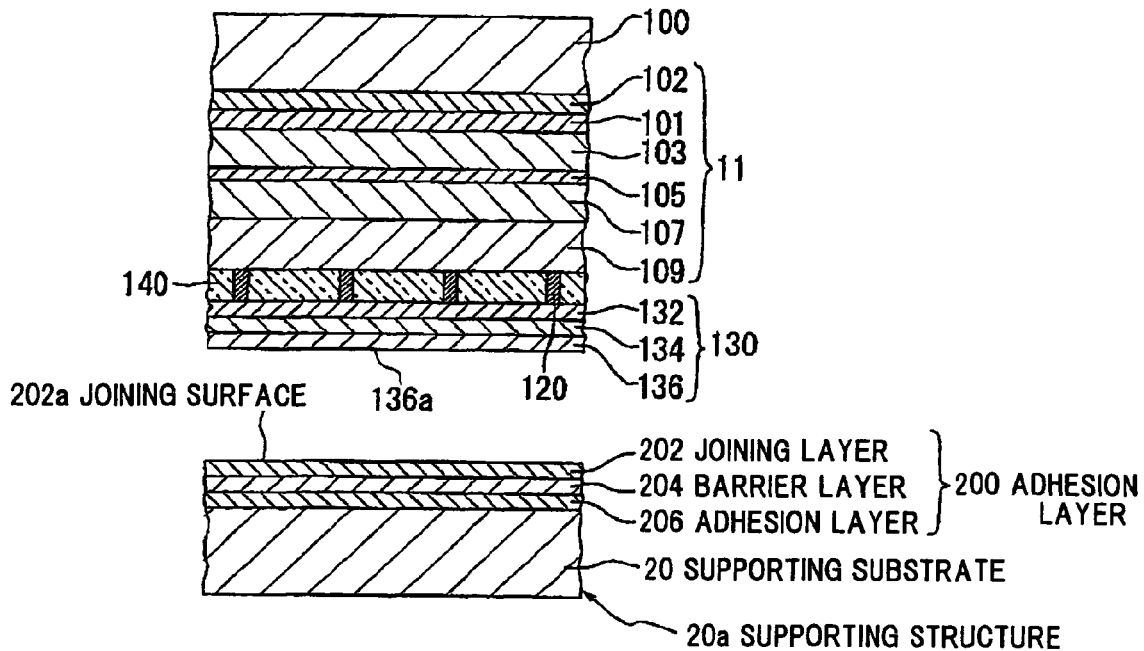
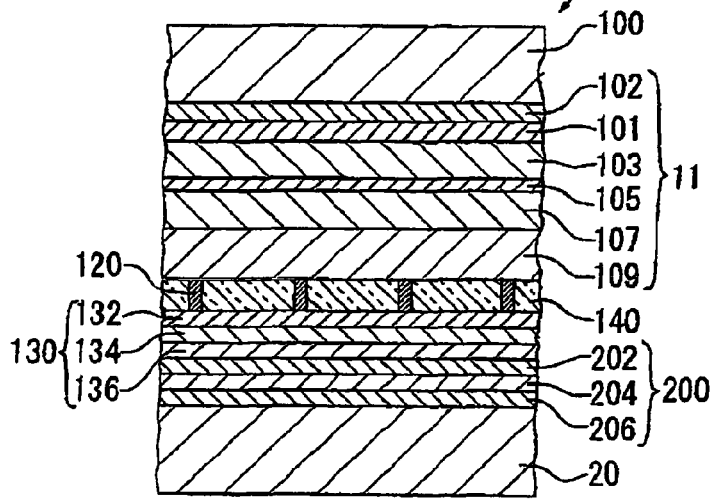

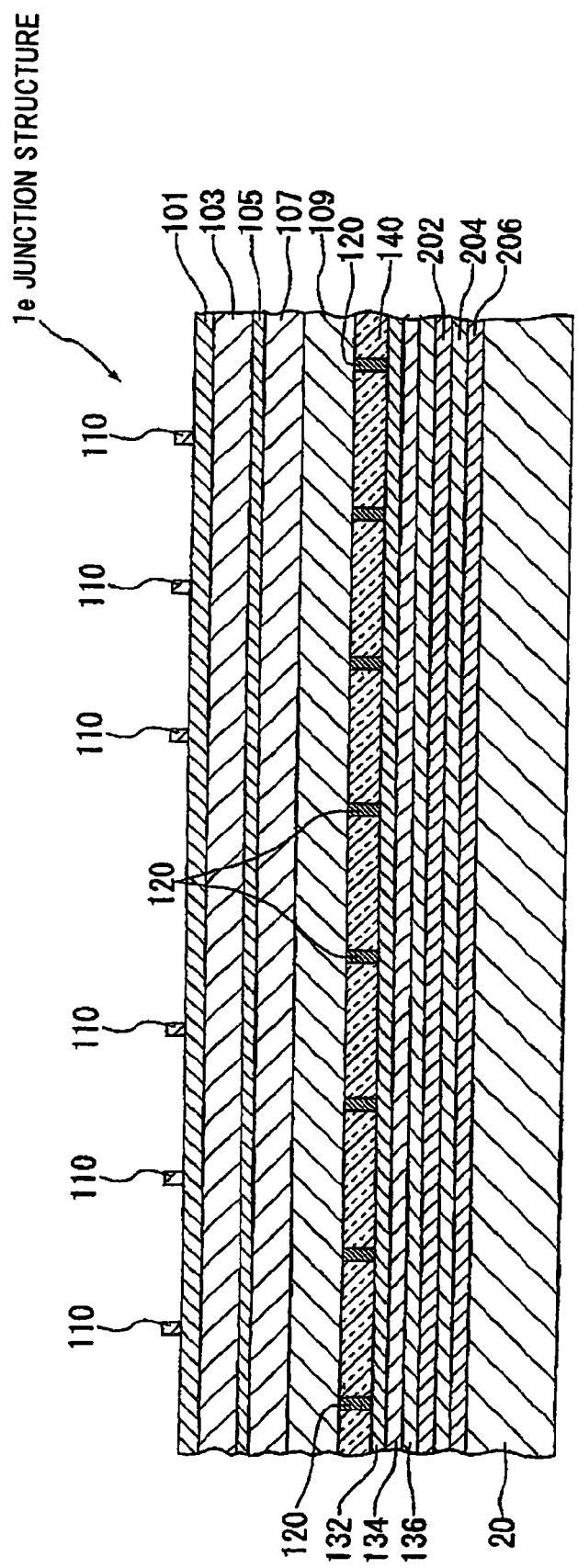

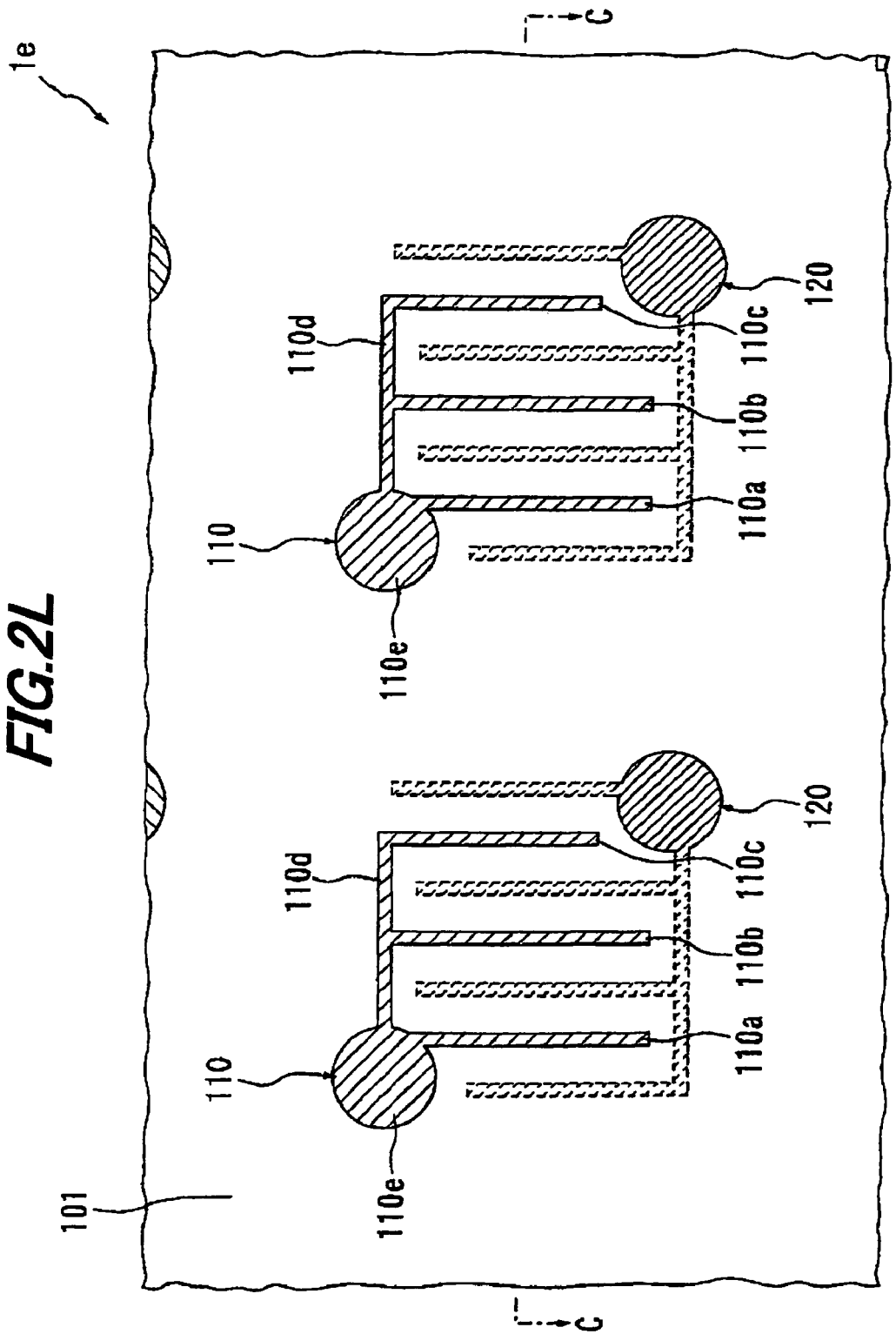

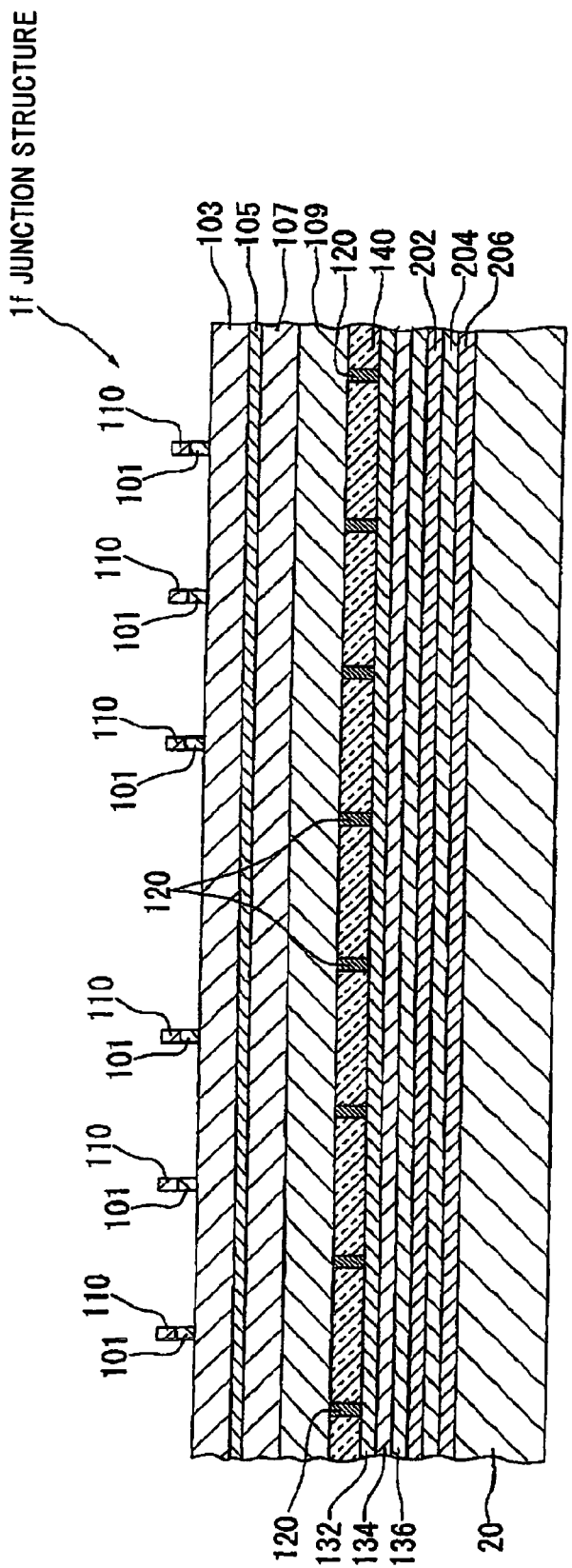

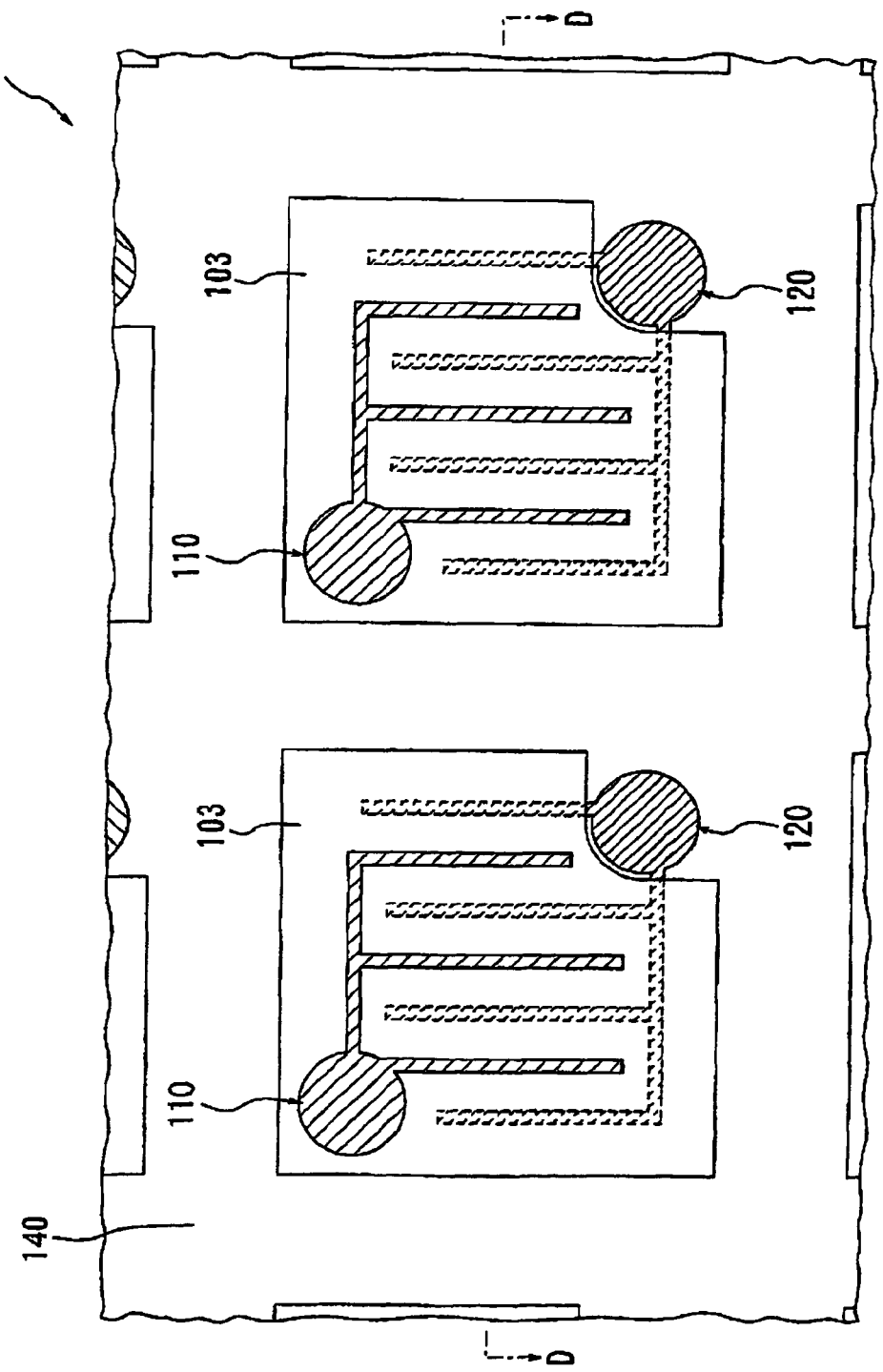

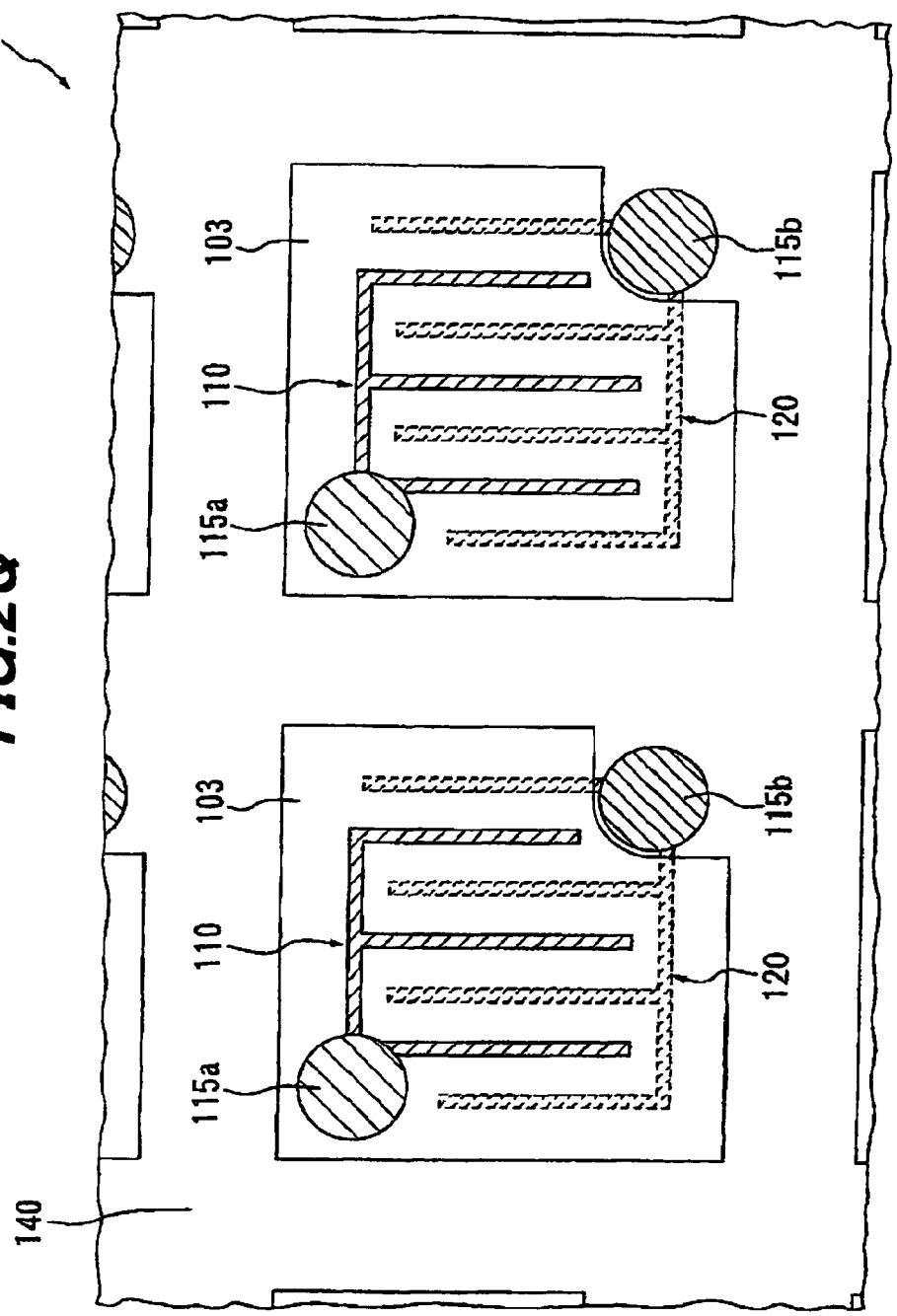

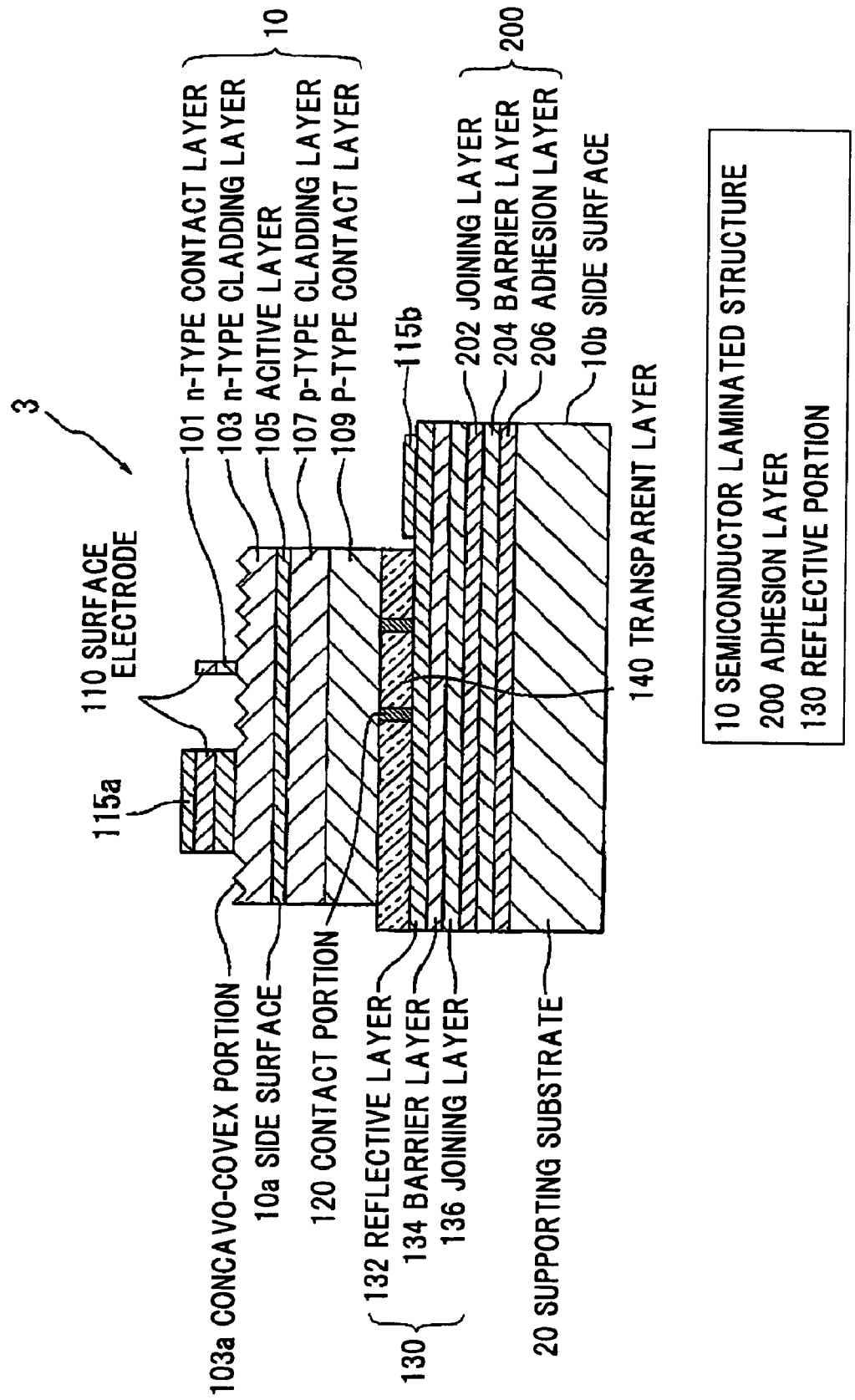

LIGHT-EMITTING ELEMENT

The present application is based on Japanese Patent Application No. 2008-249673 filed on Sep. 29, 2008, the entire contents of which are incorporated herein by reference.

BACKGROUND OF THE INVENTION

1. Field of the Invention

The invention relates to a light-emitting element and, in particular, relates to a high-intensity light-emitting element.

2. Related Art

A conventional light-emitting element is known which includes a silicon supporting substrate, a metal reflective layer provided on one surface of the silicon supporting substrate, an light-transmissive film provided on the metal reflective layer, a semiconductor laminated structure provided in a region which is a portion of the light-transmissive film and having an active layer, a cathode electrode provided on the semiconductor laminated structure, and an anode electrode provided in a region of the light-transmissive film where the semiconductor laminated structure does not exist (e.g., see JP-A 2005-175462).

In the light-emitting element described in JP-A 2005-175462, since the both of the anode and cathode electrodes face one surface side, it is possible to supply an electric current to the light-emitting element from a light-emitting surface side from where light emitted by the active layer is radiated to outside.

However, since the light-emitting element described in JP-A 2005-175462 is provided with the anode electrode on the light-transmissive film, the electric current supplied to the anode electrode may not be sufficiently diffused into the light-transmissive film, and a high-intensity light-emitting element may not be provided.

SUMMARY OF THE INVENTION

Therefore, it is an object of the invention to provide a high-intensity light-emitting element.

(1) According to one embodiment of the invention, a light-emitting element comprises:

a semiconductor laminated structure comprising a first semiconductor layer of a first conductivity type, a second semiconductor layer of a second conductivity type different from the first conductivity type and an active layer sandwiched by the first and second semiconductor layers;

a first electrode on one surface side of the semiconductor laminated structure;

a conductive reflective layer on an other surface side of the semiconductor laminated structure for reflecting light emitted from the active layer;

a contact portion partially formed between the semiconductor laminated structure and the conductive reflective layer and being in ohmic contact with the semiconductor laminated structure; and a second electrode on a part of a surface of the conductive reflective layer on the semiconductor laminated structure without contacting the semiconductor laminated structure for feeding current through the conductive reflective layer to the contact portion.

In the above embodiment (1), the following modifications and changes can be made.

(i) The light-emitting element further comprises:

a supporting substrate on which the conductive reflective layer is formed; and a transparent layer formed between the semiconductor laminated structure and the conductive reflective layer and comprising an opening, wherein the opening is formed on the transparent layer except directly under the first electrode, the contact portion is formed in the opening, and the semiconductor laminated structure is supported by the supporting substrate via the transparent layer.

(ii) The transparent layer comprises one selected from $SiO_2$, SiN and ITO.

(iii) The semiconductor laminated structure is partially removed from the one surface to the other surface, a part of the opening is formed on the conductive reflective layer corresponding to a region that the semiconductor laminated structure is partially removed, and the second electrode is in contact with the contact portion formed in the part of the opening.

(iv) The semiconductor laminated structure is partially removed from the one surface to the other surface, the transparent layer is not formed on the conductive reflective layer corresponding to a region that the semiconductor laminated structure is partially removed, and the second electrode is in contact with the conductive reflective layer corresponding to a region that the transparent layer is not formed.

Points of the Invention

According to one embodiment of the invention, a second pad electrode is directly in contact with a contact portion formed of a metal material such that current fed to the second pad electrode is fed to a p-type contact layer through the contact portion (i.e., comb-shaped linear portions). Namely, current fed through the second electrode pad is fed through the contact portion directly under the second electrode pad, the conductive reflective layer, the contact portion (i.e., comb-shaped linear portions) connected to the p-type contact layer, to the p-contact layer. The contact portion (i.e., comb-shaped linear portions) is shaped or positioned such that current is substantially uniformly supplied to the substantially whole surface of the p-type contact layer. Thus, since current supplied to a light-emitting element can be substantially uniformly dispersed in the plane of the p-type contact layer, the dispersed current can be also substantially uniformly dispersed in the plane of the active layer. As a result, it is possible to obtain a high-intensity light-emitting element.

BRIEF DESCRIPTION OF THE DRAWINGS

Next, the present invention will be explained in more detail in conjunction with appended drawings, wherein:

FIG. 1A is a schematic top view showing a light-emitting element in a first preferred embodiment of the invention;

FIG. 4 is a cross sectional view showing a light-emitting element in a second embodiment of the invention.

DESCRIPTION OF THE PREFERRED EMBODIMENTS

First Embodiment

Figure 1B:
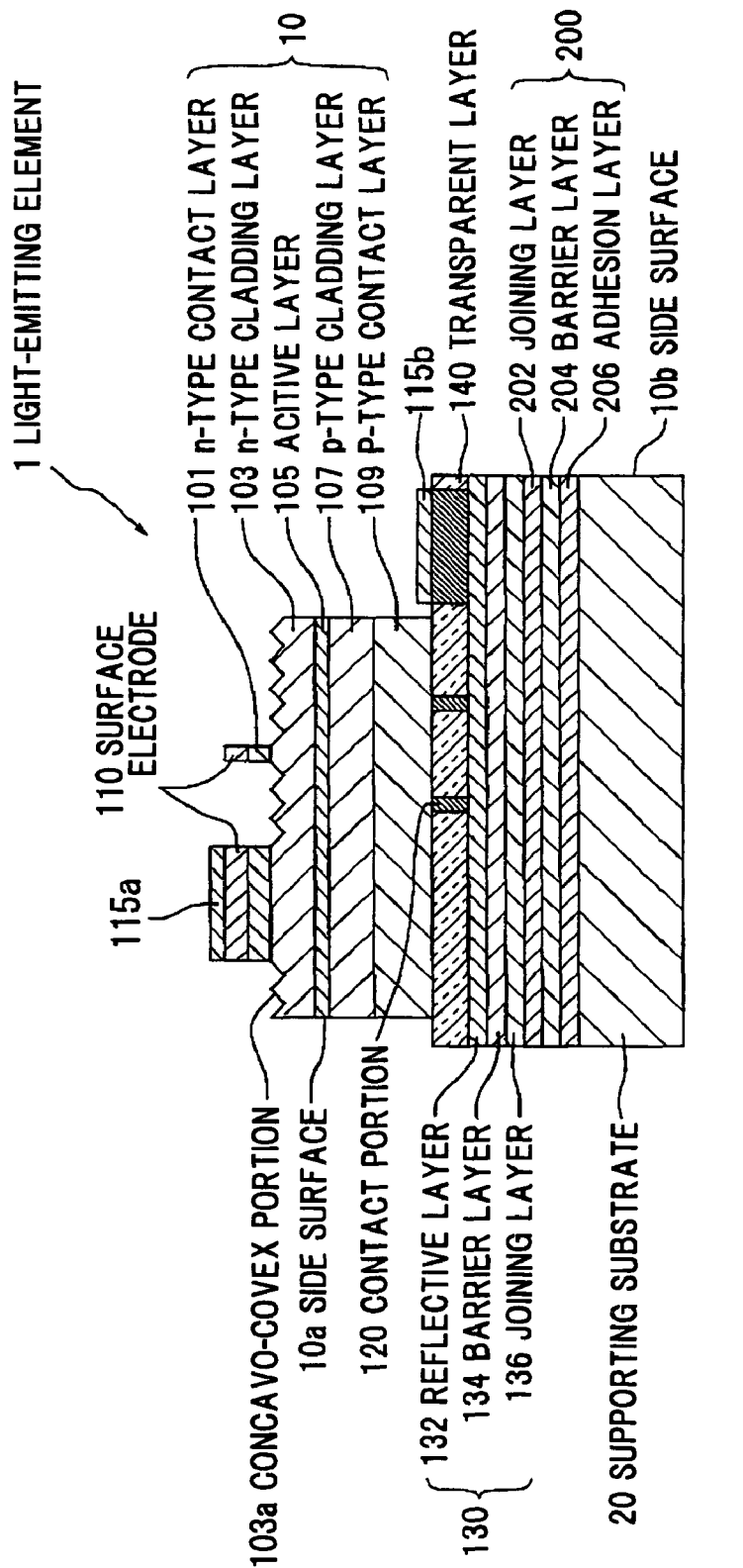
FIG. 1B is a schematic cross sectional view showing the light-emitting element in the first embodiment.

FIG. 1A is a schematic top view showing a light-emitting element in a first preferred embodiment of the invention. In addition, FIG. 1B is a schematic cross sectional view showing the light-emitting element in the first embodiment of the invention. FIG. 1B is a schematic cross sectional view taken on line A-A of FIG. 1A.

Structural Overview of Light-Emitting Element 1

As shown in FIG. 1B, a light-emitting element 1 in the first embodiment is provided with a semiconductor laminated structure 10 having an active layer 105 which emits light with a predetermined wavelength, a surface electrode 110 as a first electrode electrically connected to a region which is a portion of one surface of the semiconductor laminated structure 10, a first pad electrode 115a as a wire bonding pad provided on the surface electrode 110, a contact portion 120 in ohmic contact with a portion of another surface of the semiconductor laminated structure 10, a transparent layer 140 provided in contact with the other side of the semiconductor laminated structure 10 excluding a region where the contact portion 120 is provided, and a reflective portion 130 provided on surfaces of the contact portion 120 and the transparent layer 140 opposite to the surfaces thereof in contact with the semiconductor laminated structure 10.

Here, in the light-emitting element 1 of the present embodiment, a region of the semiconductor laminated structure 10 is partially removed from one surface to another surface of the semiconductor laminated structure 10. Then, a second pad electrode 115b as a second electrode is provided on the contact portion 120 which corresponds to the region where the semiconductor laminated structure 10 is removed. Surfaces of the first pad electrode 115a and the second pad electrode 115b are each exposed facing the same direction. In addition, the second pad electrode 115b is provided on a portion of the contact portion 120 exposed to the outside in a region where the semiconductor laminated structure 10 is removed. As a result, an electric current supplied to the second pad electrode 115b is supplied to the semiconductor laminated structure 10 via the contact portion 120.

Furthermore, the light-emitting element 1 is provided with an adhesion layer 200 having electrical conductivity provided on the reflective portion 130 opposite to the surface in contact with the contact portion 120 and the transparent layer 140, and a supporting substrate 20 provided on the adhesion layer 200 opposite to the surface in contact with the reflective portion 130.

In addition, the semiconductor laminated structure 10 of the light-emitting element 1 in the present embodiment has a p-type contact layer 109 provided in contact with the contact portion 120 and the transparent layer 140, a p-type cladding layer 107 as a second semiconductor layer of a second conductivity type provided on the p-type contact layer 109 opposite to a surface in contact with the transparent layer 140, an active layer 105 provided on the p-type cladding layer 107 opposite to a surface in contact with the p-type contact layer 109, an n-type cladding layer 103 as a first semiconductor layer of a first conductivity type provided on the active layer 105 opposite to a surface in contact with the p-type cladding layer 107, and an n-type contact layer 101 provided on a portion of a region of the n-type cladding layer 103 opposite to a surface in contact with the active layer 105.

A surface of the semiconductor laminated structure 10 opposite to a side in contact with the transparent layer 140 becomes a light extracting surface of the light-emitting element 1 in the present embodiment. In detail, a portion of a surface of the n-type cladding layer 103 opposite to a surface in contact with the active layer 105 becomes the light extracting surface. Then, a concavo-convex shaped portion 103a having continuous concavo-convex portions, in which one pair is composed of one concave portion and one convex portion, is formed on the light extracting surface of the n-type cladding layer 103 in order to improve light extraction efficiency. For example, one concave portion and another concave portion, or, one convex portion and another convex portion are formed on the surface of the n-type cladding layer 103 at predetermined intervals, thereby providing the concavo-convex shaped portion 103a on the surface of the n-type cladding layer 103.

Furthermore, the reflective portion 130 has a reflective layer 132 provided in contact with the contact portion 120 and the transparent layer 140, a barrier layer 134 provided in contact with the reflective layer 132 on a surface thereof opposite to the surface in contact with the contact portion 120 and the transparent layer 140, and a joining layer 136 provided in contact with the barrier layer 134 on a surface thereof opposite to the surface in contact with the reflective layer 132. In addition, the adhesion layer 200 has a joining layer 202 mechanically bonded to the joining layer 136 of the reflective portion 130, a barrier layer 204 provided on the joining layer 202 opposite to the surface in contact with the reflective portion 130, and an adhesion layer 206 for adhering the supporting substrate 20 provided on the barrier layer 204 opposite to the surface in contact with the joining layer 202 in order to improve adhesion with respect to the supporting substrate 20.

Here, the light-emitting element 1 has a side surface 10a as an etching side surface including a side surface of the active layer 105. In detail, the light-emitting element 1 has the side surface 10a including side surfaces of the n-type cladding layer 103, the active layer 105, the p-type cladding layer 107 and the p-type contact layer 109. In addition, the side surface 10a is formed substantially perpendicular to the surface of the supporting substrate 20. Furthermore, the light-emitting element 1 has a side surface 10b as a processed surface including side surfaces of the reflective portion 130, the adhesion layer 200 and the supporting substrate 20.

The side surface 10a is a surface created by removing respective portions of the n-type cladding layer 103, the active layer 105, the p-type cladding layer 107 and the p-type contact layer 109 by wet etching, etc. On the other hand, the side surface 10b is a surface created by mechanically cutting respective portions of the reflective portion 130, the adhesion layer 200 and the supporting substrate 20 by dicing using a dicing device, etc. Therefore, the side surface 10a has a surface smoother than that of the side surface 10b.

As shown in FIG. 1A, the light-emitting element 1 in the present embodiment is formed in a substantially square shape in top view. A planar size of the light-emitting element 1 is, as an example, 300 µm each for vertical and horizontal dimensions. The light-emitting element 1 is formed about 200 µm in thickness. Alternatively, the light-emitting element 1 in the present embodiment can be a light-emitting element having, e.g., a planar size of 500 µm or more, and as an example, a large chip size of 1 mm square.

The semiconductor laminated structure 10 is shaped such that, in top view, one corner of the semiconductor laminated structure 10 is removed from one surface to the other surface. For example, the semiconductor laminated structure 10 is notched at one corner thereof (in top view) corresponding to a region for forming the second pad electrode 115b. At the notched portion a part of the contact portion 120 formed in the openings of the transparent layer 140 is exposed and the second pad electrode 115b is formed on the exposed part of the contact portion 120. Alternatively, the semiconductor laminated structure 10 may be shaped such that, in top view, one side of the semiconductor laminated structure 10 is removed (or notched) from one surface to the other surface.

Positional Relationship of Electrodes

As shown in FIG. 1A, the surface electrode 110 is formed on the n-type cladding layer 103 so as to have a circular electrode in a substantially circular shape and plural wire electrodes electrically connected to the circular electrode. The circular electrode is not shown in FIG. 1A since it is located directly under the first pad electrode 115a.

The surface electrode 110 is provided in contact with the n-type contact layer 101, and has, e.g., a substantially comb shape in top view. The surface electrode 110 has, as an example, a thin wire electrode 110a provided adjacent to and substantially horizontal to one side of the light-emitting element 1, a thin wire electrode 110c provided adjacent to and substantially horizontal to the opposite side of the one side, and a thin wire electrode 110b provided between the thin wire electrodes 110a and 110c at a position where a distance from the thin wire electrode 110a is substantially equal to that from the thin wire electrode 110c.

Furthermore, the surface electrode 110 has a thin wire electrode 110d extending in a direction vertical to a longitudinal direction of the thin wire electrodes 110a, 110b and 110c and electrically connecting each of the thin wire electrodes 110a, 110b and 110c at the end portions thereof, and a circular electrode located directly under a region where the first pad electrode 115a is provided. In addition, a length of the thin wire electrode 110a is formed substantially equal to that of the thin wire electrode 110b, and a length of the thin wire electrode 110c provided at a position furthest from the first pad electrode 115a is formed shorter than lengths of the thin wire electrodes 110a and 110b. And then, the circular electrode of the surface electrode 110 is provided at a position including an intersection of the thin wire electrode 110a with the thin wire electrode 110d.

In addition, the contact portion 120 is provided in openings which are formed in the transparent layer 140, and is provided in regions except directly under the surface electrode 110 depending on a shape (in top view) of the surface electrode 110. The contact portion 120 is shaped or positioned such that electric current can be substantially uniformly dispersed on the other surface of the semiconductor laminated structure 10. For example, current fed through the second electrode pad 115b is fed through the contact portion 120 (i.e., circular portion 120f as described later) directly under the second electrode pad 115b, the conductive reflective layer 132, the contact portion 120 (i.e., linear portions 120a to 120e as described later) connected to the p-type contact layer 109, to the p-contact layer 109. Thus, although the contact portion 120 (i.e., the linear portions 120a to 120e) itself does not serve to disperse current in the plane of the p-type contact layer 109, it is positioned such that current can be uniformly dispersed to the regions except directly under the surface electrode 110 without being concentrated at specific region of the surface electrode 110 or the contact portion 120.

The contact portion 120 has, e.g., a substantially comb shape, similarly to the surface electrode 110. For example, the contact portion 120 has a linear portion 120a provided adjacent to and substantially horizontal to one side of the light-emitting element 1, a linear portion 120d provided adjacent to and substantially horizontal to the opposite side of the one side, a linear portion 120b provided closer to the linear portion 120a than the linear portion 120d, and a linear portion 120c provided closer to the linear portion 120d than the linear portion 120a.

Furthermore, the contact portion 120 has a linear portion 120e extending in a direction vertical to a longitudinal direction of the linear portions 120a, 120b, 120c and 120d and electrically connecting each of the linear portions 120a, 120b, 120c and 120d at the end portions thereof, and a circular portion 120f located directly under a region where the second pad electrode 115b is provided. The linear portion 120a is formed shorter than the other linear portions, and the linear portion 120d is formed longer than the other linear portions. The linear portion 120b is formed to have substantially the same length as the linear portion 120c. The linear portions 120a, 120b, 120c and 120d are each arranged at the substantially same intervals. The circular portion 120f of the contact portion 120 is provided in a region including an intersection of the linear portion 120d with the linear portion 120e. Here, a modification may be made that the linear portions 120a to 120e are not connected to (i.e., separate from) the circular portion 120f, although they are connected thereto as shown in FIG. 1A. This is because, as described above, current fed to the circular portion 120f can be fed through the conductive reflective layer 132 to the linear portions 120a to 120e connected to the p-type contact layer 109 and then to the p-contact layer 109.

In the present embodiment, the contact portion 120 is provided in a region excluding a portion directly under (in top view) the surface electrode 110. For example, the linear portions 120a and 120b are arranged at a position (in top view) sandwiching the thin wire electrode 110a. In addition, the first pad electrode 115a is provided at a position diagonal (in top view) to the second pad electrode 115b. As an example, the first pad electrode 115a and the second pad electrode 115b are formed in a circular shape having a diameter of 100 μm, and plural wire electrodes and plural linear portions are formed in a linear shape having a width of 10 μm.

Semiconductor Laminated Structure 10

The semiconductor laminated structure 10 in the present embodiment is formed having a AlGaInP-based compound semiconductor which is a III-V group compound semiconductor. For example, the semiconductor laminated structure 10 has a configuration in which the active layer 105 formed of a bulk of an undoped AlGaInP-based compound semiconductor which is not doped with dopant as an impurity is sandwiched by the n-type cladding layer 103 formed containing n-type AlGaInP and the p-type cladding layer 107 formed containing p-type AlGaInP.

The active layer 105 emits light with a predetermined wavelength when an electric current is supplied from the outside. The active layer 105 is formed of, e.g., a semiconductor material which emits red light with a wavelength of around 630 nm. The active layer 105 is formed of, e.g., an undoped $(Al_{0.1}Ga_{0.9})_{0.5}In_{0.5}P$ layer. In addition, the n-type cladding layer 103 contains n-type dopant such as Si or Se, etc., at a predetermined concentration. The n-type cladding layer 103 is formed of, e.g., a Si-doped n-type $(Al_{0.7}Ga_{0.3})_{0.5}In_{0.5}P$ layer. Furthermore, the p-type cladding layer 107 contains p-type dopant such as Zn or Mg, etc., at a predetermined concentration. The p-type cladding layer 107 is formed of, e.g., a Mg-doped p-type $(Al_{0.7}Ga_{0.3})_{0.5}In_{0.5}P$ layer.

Furthermore, the p-type contact layer 109 of the semiconductor laminated structure 10 is formed of, e.g., a p-type GaP layer to which Mg is doped at a predetermined concentration. The n-type contact layer 101 is formed of a GaAs layer to which Si is doped at a predetermined concentration. Here, the n-type contact layer 101 is provided in a region for forming the surface electrode 110 on an upper surface of the n-type cladding layer 103.

Contact Portion 120

The contact portion 120 is provided on a portion of the surface of the p-type contact layer 109 excluding a region directly under the surface electrode 110. The contact portion 120 is formed of a material in ohmic contact with the p-type contact layer 109, e.g., formed of a metal material containing Au or Zn. In the present embodiment, as shown in FIG. 1A, the contact portion 120 has a shape with plural linear portions and a circular portion provided at a position corresponding to a region where the second pad electrode 115b is provided.

Transparent Layer 140

The transparent layer 140 is provided in a region which is a surface of the reflective layer 132 and in which the contact portion 120 is not provided. The transparent layer 140 is formed of a material which transmits light with a wavelength emitted by the active layer 105, e.g., formed of a transparent dielectric layer such as $SiO_2$, $TiO_2$ or SiNx, etc. In addition, when the wavelength of the light emitted by the active layer 105 is λ and a refractive index of a material composing the transparent layer 140 is n, the transparent layer 140 is formed (2×λ)/(4×n) or more in thickness. Alternatively, the transparent layer 140 can be formed of a transparent conductive layer containing a metal oxide material having conductivity lower than that of the contact portion 120, such as ITO (Indium Tin Oxide), etc.

In addition, it is possible to form the transparent layer 140 by a thin film laminated structure formed of plural materials each having different refractive indexes. In other words, the transparent layer 140 can have a Distributed Bragg Reflector (DBR) structure. For example, it is possible to form the transparent layer 140 having the DBR structure in which a paired layer, which is a pair of a layer formed of a $SiO_2$ having a predetermined film thickness and a layer formed of a $TiO_2$ having a predetermined film thickness, are laminated multiple times.

Reflective Portion 130

The reflective layer 132 of the reflective portion 130 is formed of a conductive material having a high refractive index with respect to the light emitted by the active layer 105. The reflective layer 132 is formed of, e.g., a conductive material having a refractive index of 80% or more with respect to such light. Among the light emitted by the active layer 105, the reflective layer 132 reflects light reached the reflective layer 132 toward the active layer 105 side. The reflective layer 132 is formed of, e.g., a metal material such as Al, Au or Ag, etc., or an alloy containing at least one metal material selected from these metal materials. As an example, the reflective layer 132 is formed of Al with a predetermined film thickness. The barrier layer 134 of the reflective portion 130 is formed of a metal material such as Ti or Pt, etc., and as an example, formed of Ti with a predetermined film thickness. The barrier layer 134 suppresses propagation of material composing the joining layer 136 to the reflective layer 132. In addition, the joining layer 136 is formed of a material electrically and mechanically joining the adhesion layer 200 to the joining layer 202, e.g., formed of Au with a predetermined film thickness.

Supporting Substrate 20

The supporting substrate 20 is formed of a material having sufficient mechanical strength for handling the light-emitting element 1. The supporting substrate 20 can be formed of, e.g., a semiconductor substrate such as a p-type or n-type conductive Si substrate, a Ge substrate, a GaAs substrate or a GaP substrate, etc., or a metal substrate formed of a metal material such as Cu, etc. In the present embodiment, it is possible to use, e.g., a conductive Si substrate as the supporting substrate 20. Alternatively, the supporting substrate 20 can be also formed of a material not having conductivity, such as, for example, a glass substrate or sapphire substrate, etc.

The joining layer 202 of the adhesion layer 200 can be formed of Au with a predetermined film thickness in the same manner as the joining layer 136 of the reflective portion 130.

In addition, the barrier layer 204 is formed of a metal material such as Ti or Pt, etc., and as an example, can be formed of Pt with a predetermined film thickness. The barrier layer 204 joins the adhesion layer 206 to the joining layer 202 and suppresses propagation of material composing the joining layer 202 to the supporting substrate 20 side, thereby suppressing decrease of adhesion of the joining layer 202 with respect to the joining layer 136. Furthermore, the adhesion layer 206 for adhering the supporting substrate 20 joins the supporting substrate 20 to the joining layer 202 and the barrier layer 204. The adhesion layer 206 can be formed of, e.g., Ti with a predetermined film thickness. Alternatively, when a metal material or an alloy material having both functions of the barrier layer 204 and the adhesion layer 206 is used, it is possible to form only the adhesion layer 206 without providing the barrier layer 204.

The light-emitting element 1 is mounted, facing a rear surface of the supporting substrate 20 downward, at a predetermined position of a stem formed of a metal such as Cu, etc., using a conductive junction material such as Ag paste or a eutectic material such as AuSu, etc.

Modifications of the First Embodiment

Although the light-emitting element 1 in the present embodiment emits light including red light with a wavelength of 630 nm, the wavelength of the light emitted by the light-emitting element 1 is not limited thereto. It is possible to form the light-emitting element 1 which emits light within a predetermined wavelength range by controlling a structure of the active layer 105 of the semiconductor laminated structure 10. The light emitted by the active layer 105 includes the light within a wavelength range such as, e.g., orange light, yellow light or green light, etc. In addition, the semiconductor laminated structure 10 included in the light-emitting element 1 can be formed of a InAlGaN-based compound semiconductor including the active layer 105 which emits light in an ultraviolet region, a violet region or a blue region.

Furthermore, in the semiconductor laminated structure 10 included in the light-emitting element 1, a conductivity type of a compound semiconductor composing the semiconductor laminated structure 10 can be reversed from the first embodiment. For example, the conductivity type of the n-type contact layer 101 and the n-type cladding layer 103 can be replaced with p-type and the conductivity type of the p-type cladding layer 107 and the p-type contact layer 109 can be replaced with n-type. In addition, it is possible to provide the concavo-convex shaped portion 103a on the surface of the n-type cladding layer 103 by forming concavo-convex portions having no regularity on the surface of the n-type cladding layer 103.

In addition, the supporting substrate 20 is formed in a shape having a substantially constant line width, however, a portion having a line width different from the other portions can be formed on a portion of the supporting substrate 20 in a modification.

In addition, the planar size of the light-emitting element 1 is not limited to the above-mentioned embodiment. For example, the planar size of the light-emitting element 1 can be designed so that each of vertical and horizontal dimensions is substantially 500 μm or more or over 1 mm, or, it is possible to form the light-emitting element 1 by appropriately changing the vertical and horizontal dimensions depending on the intended use of the light-emitting element 1. In this case, a shape (in top view) of the light-emitting element 1 is substantially rectangular.

In addition, the active layer 105 can be formed having a quantum well structure. The quantum well structure can be formed from any of a single quantum well, a multiple quantum well or a strained multiple quantum well.

Fabricating Method of Light-Emitting Element 1

Figure 2A:
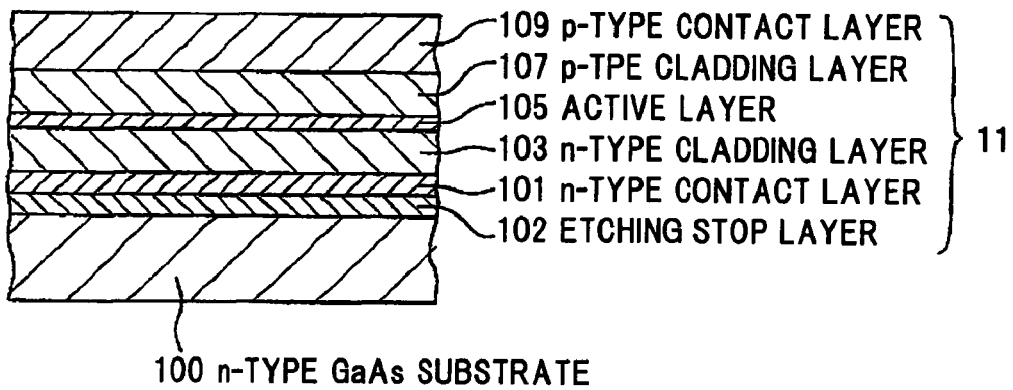
FIGS. 2A to 2R are views showing a process for fabricating the light-emitting element in the first embodiment.
Figure 2B:
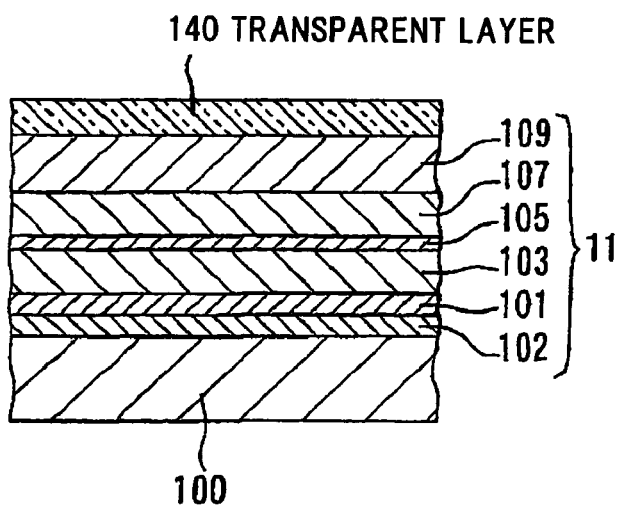
Figure 2C:
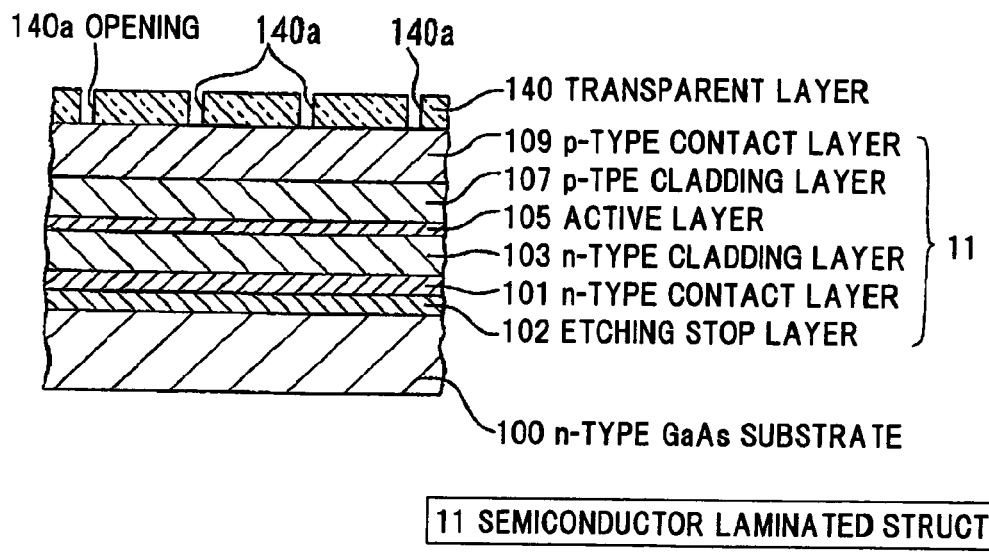
Figure 2D:
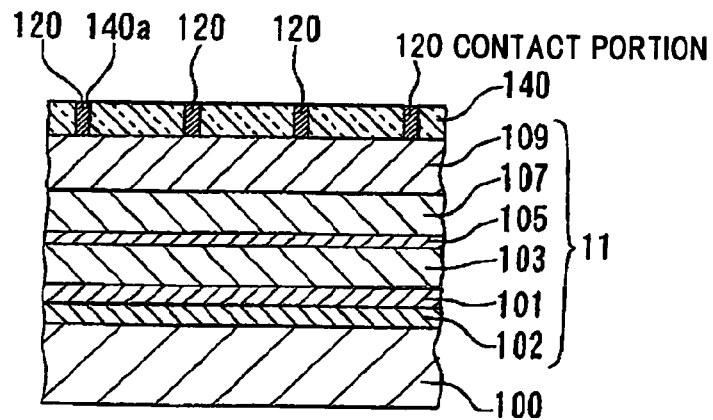
Figure 2E:
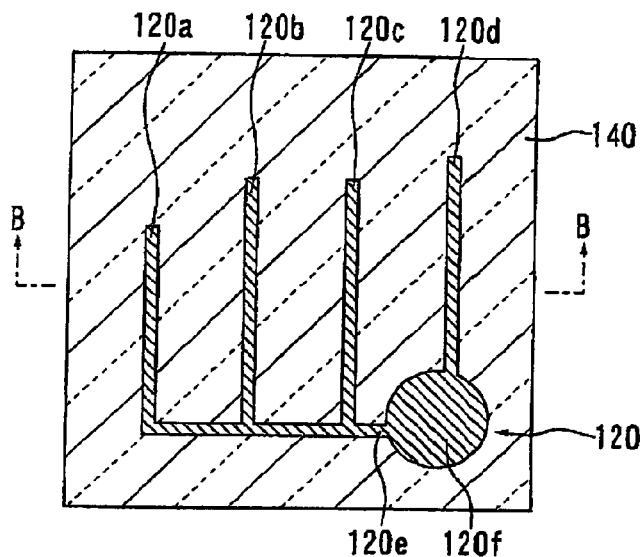
Figure 2F:
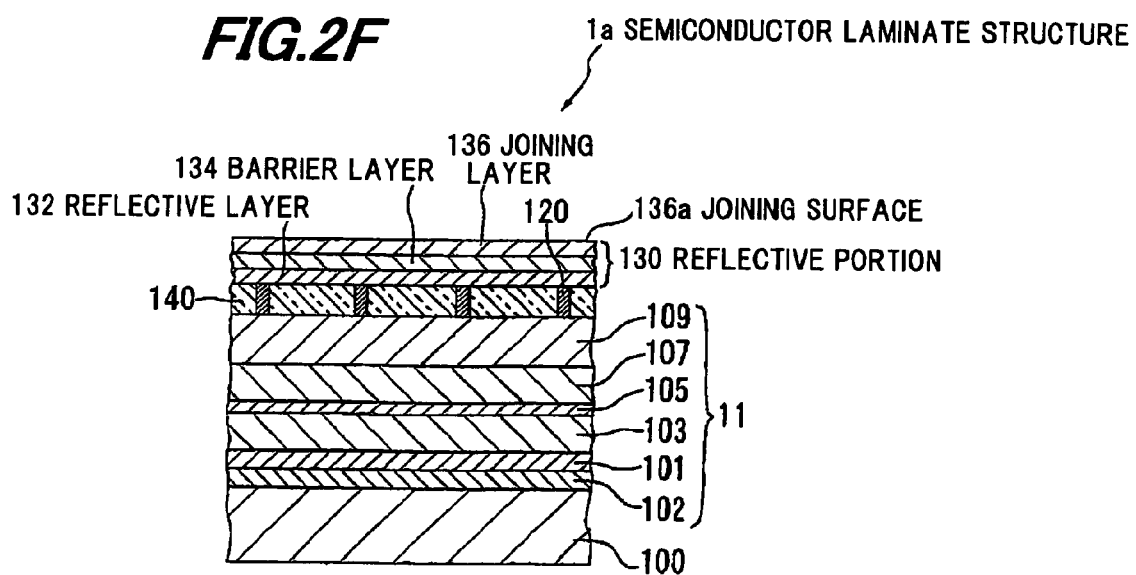
Figure 2I:
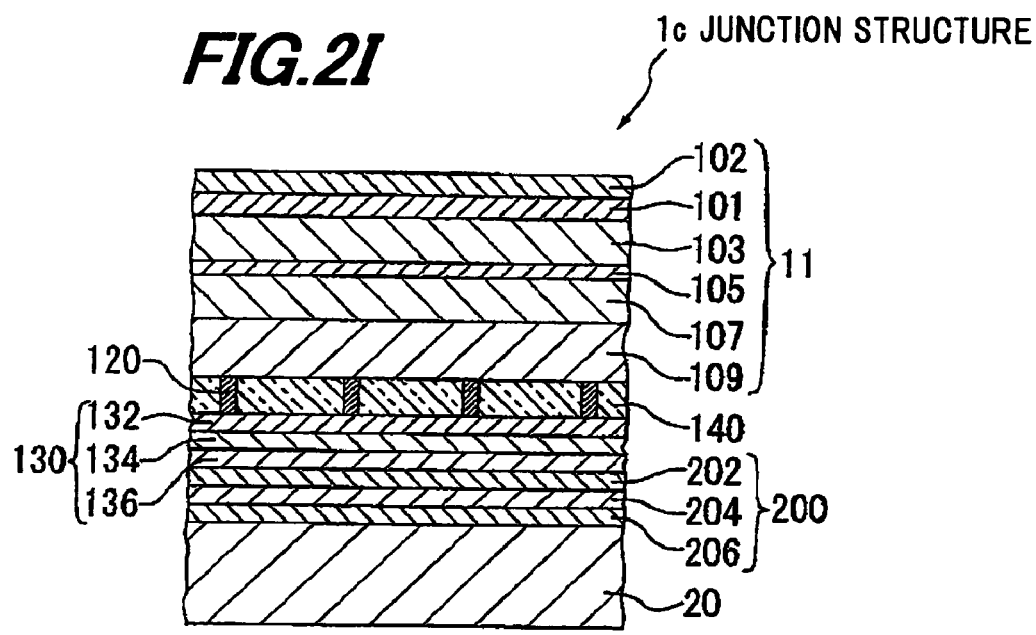
Figure 2J:
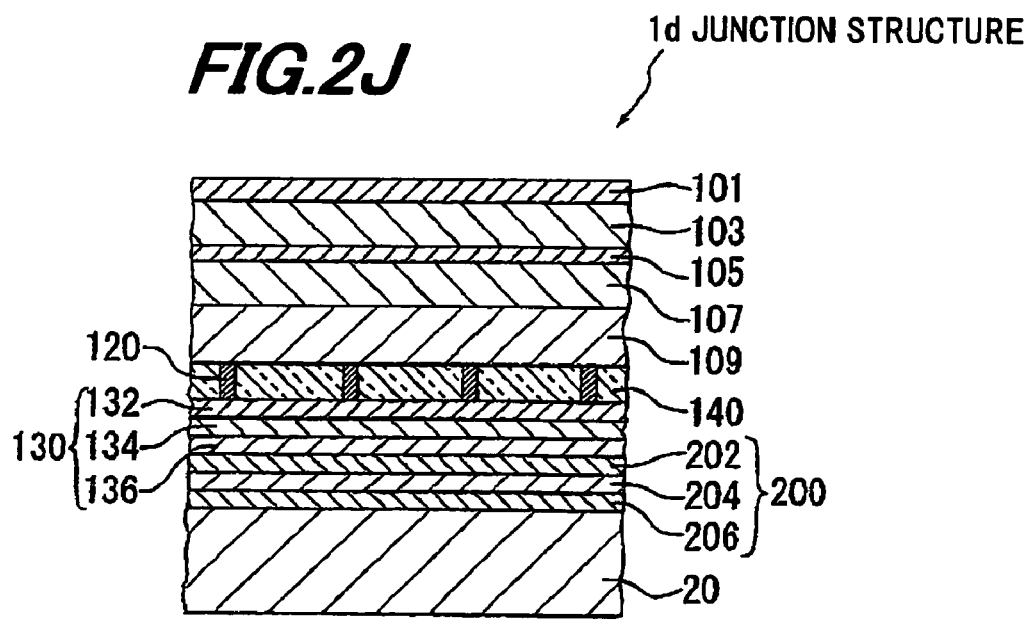
Figure 2N:
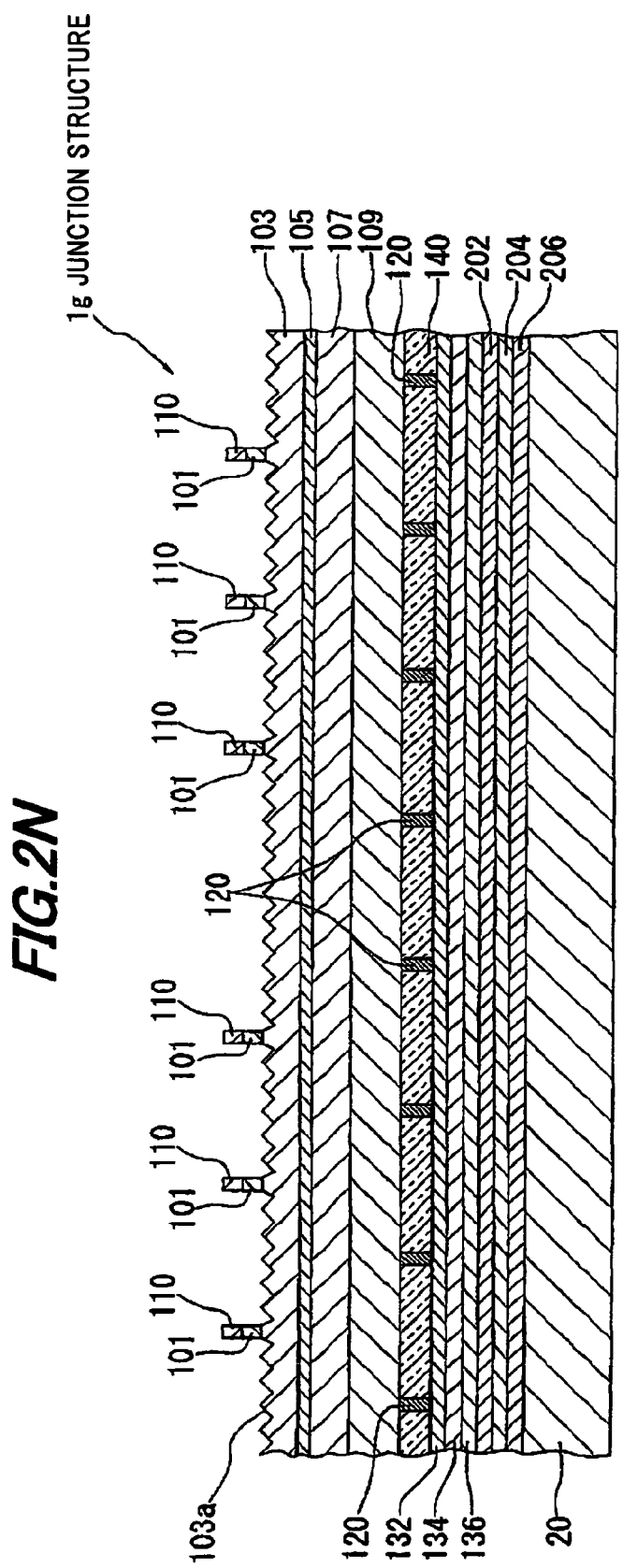
Figure 2R:
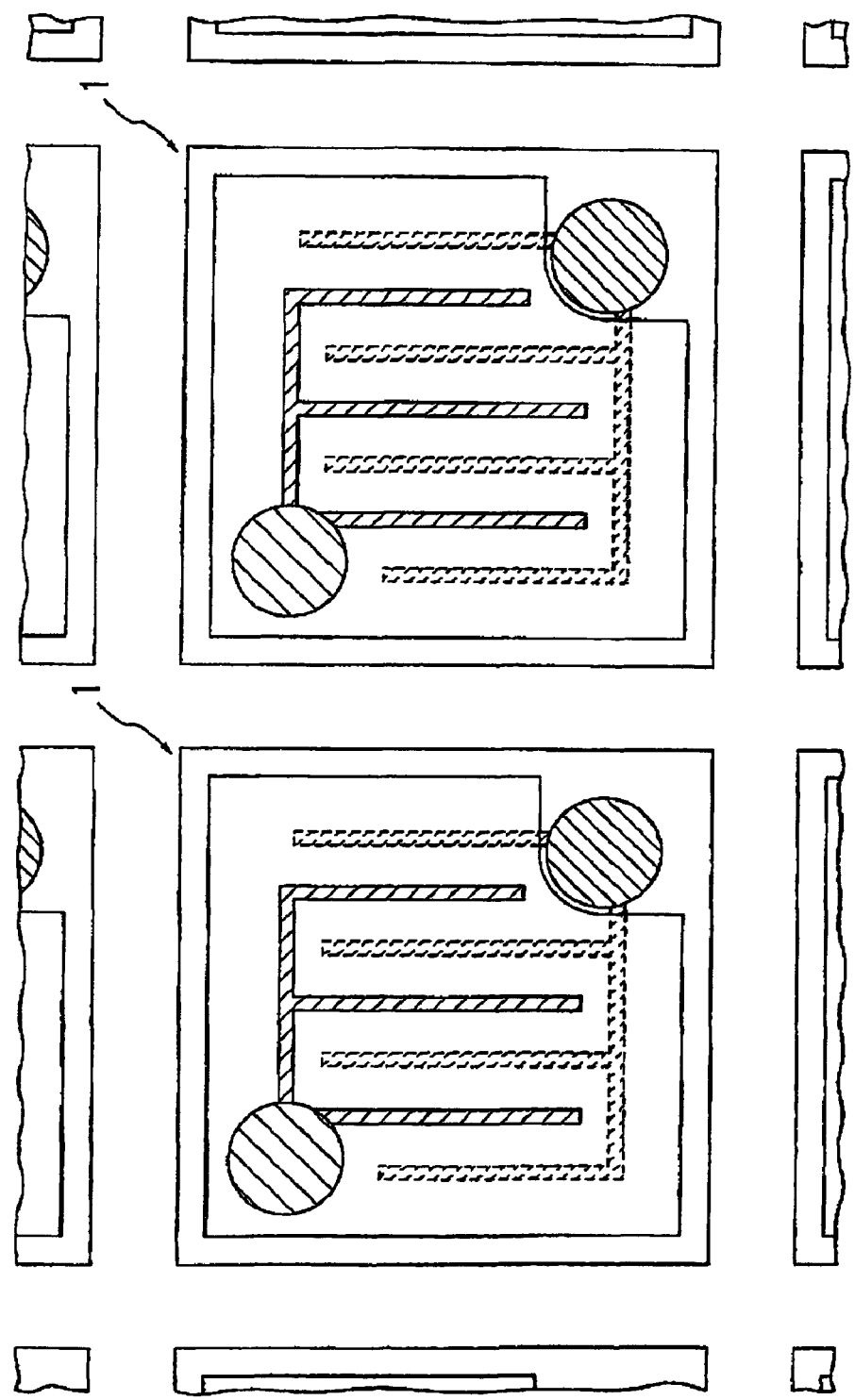

FIGS. 2A to 2R show a flow for fabricating the light-emitting element in the first embodiment of the invention.

Firstly, as shown in FIG. 2A, an AlGaInP-based semiconductor laminated structure 11 including plural compound semiconductor layers is formed on an n-type GaAs substrate 100 by, e.g., a Metal Organic Vapor Phase Epitaxy (MOVPE) method. As an example, an etching stop layer 102 having undoped $(Al_{0.7}Ga_{0.3})_{0.5}In_{0.5}P$, an n-type contact layer 101 having Si-doped n-type GaAs, an n-type cladding layer 103 having Si-doped n-type $(Al_{0.7}Ga_{0.3})_{0.5}In_{0.5}P$, an active layer 105 having undoped $(Al_{0.1}Ga_{0.9})_{0.5}In_{0.5}P$, a p-type cladding layer 107 having Mg-doped p-type $(Al_{0.7}Ga_{0.3})_{0.5}In_{0.3}P$ and a p-type contact layer 109 having Mg-doped p-type GaP are formed on the n-type GaAs substrate 100 in this order using the MOVPE method. As a result, an epitaxial wafer having the semiconductor laminated structure 11 formed on the n-type GaAs substrate 100 is formed.

Here, formation of the semiconductor laminated structure 11 using the MOVPE method is carried out by setting a growth temperature to 650° C., growth pressure to 6666.1 Pa (50 Torr), each growth rate of plural compound semiconductor layers of the semiconductor laminated structure 11 to 0.3-1.0 nm/sec, and a V/III ratio to around 200. The V/III ratio is a mole ratio of a V group material such as arsine ($AsH_3$) or phosphine ($PH_3$), etc., with reference to a mole ratio of a III group material such as trimethylgallium (TMGa) or trimethylaluminum (TMAl), etc.

In addition, as a raw material used in the MOVPE method, it is possible to use an organic metallic compound such as trimethylgallium (TMGa), triethylgallium (TEGa), trimethylaluminum (TMAl) or trimethylindium (TMIn), etc., and a hydride gas such as arsine ($AsH_3$) or phosphine ($PH_3$), etc. In addition, disilane ($Si_2H_6$) can be used for a raw material of an n-type dopant. Meanwhile, bis-cyclopentadienyl magnesium ($Cp_2Mg$) can be used for a raw material of a p-type dopant.

Alternatively, hydrogen selenide ($H_2Se$), monosilane ($SiH_4$), diethyl-tellurium (DETe) or dimethyl tellurium (DMTe) can be also used as a raw material of the n-type dopant. In addition, dimethyl zinc (DMZn) or diethyl zinc (DEZn) can be also used as a raw material of the p-type dopant.

Alternatively, the semiconductor laminated structure 11 on the n-type GaAs substrate 100 can be formed using a Molecular Beam Epitaxy (MBE) method or a Halide Vapor Phase Epitaxy (HVPE) method, etc.

Next, as shown in FIG. 2B, after taking out the epitaxial wafer formed in FIG. 2A from the MOVPE equipment, the transparent layer 140 is formed on the surface of the p-type contact layer 109. In detail, a $SiO_2$ film as the transparent layer 140 is formed on the surface of the p-type contact layer 109 using a plasma CVD (Chemical Vapor Deposition) device. When the transparent layer 140 is formed of plural layers, it is possible to form the transparent layer 140 by a vacuum deposition method.

Next, as shown in FIG. 2C, an opening 140a is formed on the transparent layer 140 using a photolithography method and an etching method. For example, a photoresist pattern having a trench in a region for forming the opening 140a is formed on the transparent layer 140. The opening 140a is formed penetrating from a surface of the transparent layer 140 to an interface between the p-type contact layer 109 and the transparent layer 140. In detail, the transparent layer 140 in a region where the photoresist pattern is not formed is removed using an etchant as hydrofluoric acid-based etchant solution, thereby forming the opening 140a on the transparent layer 140. The opening 140a is formed in a region where the contact portion 120 explained in FIG. 1A is provided.

Following this, as shown in FIG. 2D, an AuZn alloy as a raw material composing the contact portion 120 is formed in the opening 140a using the vacuum deposition method. The contact portion 120 is formed by, e.g., vacuum-depositing AuZn in the opening 140a using the photoresist pattern used for forming the opening 140a as a mask. As a result, the contact portion 120 having a shape shown in FIG. 2E is formed. Since the detail of the shape of the contact portion 120 is described in "Positional relation of electrodes", the explanation thereof will be omitted. In addition, a cross section taken on line B-B of FIG. 2E corresponds to FIG. 2D.

Next, as shown in FIG. 2F, an Al layer as the reflective layer 132, a Ti layer as the barrier layer 134 and an Au layer as the joining layer 136 are formed using the vacuum deposition method or a sputtering method. As a result, a semiconductor laminated structure 1a is formed. Alternatively, the barrier layer 134 can be formed by laminating layers formed of a high-melting-point material such as a Ti layer of a Pt layer, etc. In addition, for the reflective layer 132, a material having a high refractive index is selected depending on the wavelength of the light emitted by the active layer 105.

Then, as shown in FIG. 2G, Ti as the adhesion layer 206 for adhering the supporting substrate 20, Pt as the barrier layer 204 and Au as the joining layer 202 are formed on a Si substrate as the supporting substrate 20 in this order using the vacuum deposition method. As a result, a support structure 20a is formed. Following this, a joining surface 136a which is a surface of the joining layer 136 of the semiconductor laminated structure 1a and a bonded surface 202a which is a surface of the joining layer 202 of the support structure 20a are overlapped facing each other, and this state is maintained by a jig formed of carbon, etc.

Following this, the jig maintaining the overlapped state of the semiconductor laminated structure 1a and the support structure 20a is introduced into a wafer bonding apparatus. Then, inside of the wafer bonding apparatus is adjusted to a predetermined pressure. As an example, the pressure is set to 1.333 Pa (0.01 Torr). Then, the pressure is applied to the semiconductor laminated structure 1a and the support structure 20a which overlap each other via the jig. As an example, 30 kgf/cm² of pressure is applied. Next, the jig is heated to a predetermined temperature at a predetermined temperature increase rate.

In detail, the temperature of the jig is heated to 350° C. After the temperature of the jig reaches about 350° C., the jig is maintained at this temperature for 30 minutes. After that, the jig is gradually cooled. The temperature of the jig is sufficiently lowered to, e.g., a room temperature. After the temperature of the jig is lowered, the pressure applied to the jig is released. Then, the pressure in the wafer bonding apparatus is adjusted to atmospheric pressure and the jig is taken out. As a result, as shown in FIG. 2H, a junction structure 1b in which the semiconductor laminated structure 1a and the support structure 20a are mechanically joined between the joining layer 136 and the joining layer 202 is formed.

In the present embodiment, the semiconductor laminated structure 1a has the barrier layer 134. Therefore, even when the semiconductor laminated structure 1a and the support structure 20a are joined with the joining surface 136a and the bonded surface 202a, diffusion of materials forming the joining layer 136 and the joining layer 202 into the reflective layer 132 is suppressed, and it is thereby possible to suppress deterioration of reflection characteristics of the reflective layer 132.

Next, the junction structure 1b is bonded to a jig of a polishing apparatus by bonding wax. In detail, the supporting substrate 20 side of the junction structure 1b is bonded to the jig. Then, the n-type GaAs substrate 100 of the junction structure 1b is polished up to a predetermined thickness. Following this, the polished junction structure 1b is taken out from the jig of the polishing apparatus and the wax adhered to the surface of the supporting substrate 20 is removed by washing. Then, as shown in FIG. 2I, the n-type GaAs substrate 100 is selectively and completely removed from the polished junction structure 1b using an etchant for GaAs etching, thereby forming a junction structure 1c in which the etching stop layer 102 is exposed. The etchant for GaAs etching includes, e.g., a mixed solution of ammonia water and hydrogen peroxide solution. Alternatively, it is possible to remove the whole n-type GaAs substrate 100 by etching without polishing the n-type GaAs substrate 100.

As shown in FIG. 2J, the etching stop layer 102 is removed from the junction structure 1c by etching using a predetermined etchant. As a result, a junction structure 1d in which the etching stop layer 102 is removed is formed. When the etching stop layer 102 is formed of an AlGaInP-based compound semiconductor, it is possible to use an etchant to containing hydrochloric acid for the predetermined etchant. As a result, the surface of the n-type contact layer 101 is exposed to the outside.

Following this, the surface electrode 110 is formed at a predetermined position on a surface of the n-type contact layer 101 using the photolithography method and the vacuum deposition method. In detail, the surface electrode 110 shown in FIG. 2L is formed on the n-type contact layer 101. The surface electrode 110 is composed of the circular electrode 110e having a diameter of 100 μm and plural wire electrodes (the thin wire electrode 110a or 110d) having a width of 10 μm. Since the detail of the shape of the surface electrode 110 is described in "Positional relation of electrodes", the explanation thereof will be omitted.

The surface electrode 110 is formed by depositing AuGe, Ti and Au on the n-type contact layer 101 in this order. In this case, the surface electrode 110 is formed so as not to be located directly over the contact portion 120. As a result, as shown in FIG. 2K, a junction structure 1e having the surface electrode 110 is formed. FIG. 2K is a cross section taken on line C-C of FIG. 2L.

Next, as shown in FIG. 2M, the n-type contact layer 101 excluding the n-type contact layer 101 corresponding to a portion directly under the surface electrode 110 is removed by etching using a mixed solution of sulfuric acid, hydrogen peroxide solution and water, using the surface electrode 110 formed in FIG. 2K as a mask. As a result, a junction structure 1f is formed. By using the mixed solution, the n-type contact layer 101 formed of GaAs can be selectively etched with respect to the n-type cladding layer 103 formed of n-type $(Al_{0.7}Ga_{0.3})_{0.5}In_{0.5}P$. Therefore, the surface of the n-type cladding layer 103 is exposed to the outside in the junction structure 1f.

Next, as shown in FIG. 2N, the concavo-convex shaped portion 103a is formed on a portion of the surface of the n-type cladding layer 103. In detail, a mask pattern, in which a concave pattern and a convex pattern are repeated at predetermined intervals, is formed on the surface of the n-type cladding layer 103 using the photolithography method. For example, a mask pattern, in which a concave pattern and a convex pattern are repeated at intervals within a range of not less than 1.0 μm nor more than 3.0 μm, is formed. The concave pattern and the convex pattern are formed with an arrangement in, e.g., a matrix state or a honeycomb state, etc. Then, the concavo-convex shaped portion 103a is formed on the surface of the n-type cladding layer 103 using a wet etching method, using the formed mask pattern as a mask. As a result, a junction structure 1g having the concavo-convex shaped portion 103a is formed.

Following this, a mask pattern for isolating between the light-emitting elements is formed on a surface of the junction structure 1g using the photolithography method. In other words, an inter-light-emitting element isolation mask pattern is formed on the surface of the n-type cladding layer 103 of the junction structure 1g. Here, the inter-light-emitting element isolation mask pattern in the present embodiment has a shape which allows not only isolation between the light-emitting elements but removal of plural compound semiconductor layers above the circular portion of the contact portion 120. Then, the light-emitting elements are isolated each other by removing the n-type cladding layer 103 to the p-type contact layer 109 from the surface side by the wet etching method using the mask pattern as a mask, and at least the circular portion of the contact portion 120 is exposed to the outside. As a result, as shown in FIG. 2O, a junction structure 1h, in which plural light-emitting elements are isolated each other, is formed.

FIG. 2P is a top view of the junction structure 1h. By isolating between the light-emitting elements by etching, the transparent layer 140 is exposed in an isolated region. At least the circular portion of the contact portion 120 is also exposed to the outside. As a result, the semiconductor laminated structure 10 corresponding to a region where one light-emitting element 1 is formed has a dimension smaller (in top view) than that of the reflective layer 132. FIG. 2O corresponds to a cross sectional view taken on line D-D of FIG. 2P. In addition, in FIG. 2K, the side surface 10a is a surface exposed by wet etching. Therefore, the side surface 10a has a smooth surface compared with the case where the semiconductor laminated structure 10 is mechanically cut using a dicing device, etc.

Next, an alloying step for forming each electrical junction between the contact portion 120 and the p-type contact layer 109 and between the surface electrode 110 and the n-type contact layer 101 is applied to the junction structure 1h. As an example, heat treatment is applied to the junction structure 1h in a nitrogen atmosphere as an inert atmosphere at 400° C. for 5 minutes.

Following this, by using the photolithography method and the vacuum deposition method, the first pad electrode 115a is formed on the surface of the circular electrode of the surface electrode 110, and the second pad electrode 115b is formed on the surface of the circular portion of the contact portion 120. The first pad electrode 115a and the second pad electrode 115b are formed by, e.g., respectively depositing Ti and Au, in this order, on the surface of the circular electrode of the surface electrode 110 and on the surface of the circular portion of the contact portion 120. As a result, a junction structure 1i shown in FIG. 2Q is formed.

Then, the junction structure 1i is element-isolated using a dicing device having a dicing blade. As a result, as shown in FIG. 2R, the plural light-emitting elements 1 in the present embodiment are formed. In this case, the side surface 10b is created in a region mechanically cut by the dicing blade. Since the side surface 10b is a mechanically cut region, large irregularities are generated thereon compared with the surface of the side surface 10a.

The light-emitting element 1 fabricated using each step as shown in FIGS. 2A to 2R is, as an example, a light emitting diode (LED) with an element size (planar size) in a substantially square shape having a planar size of 300 μm square. Then, the light-emitting element 1 is die-bonded to a TO-18 stem using a conductive bonding material, and the first pad electrode 115a and the second pad electrode 115b are respectively connected to a predetermined region of the TO-18 stem by a wire such as Au, etc. As a result, it is possible to evaluate characteristics of the light-emitting element 1.

In detail, an initial characteristic of the light-emitting element 1 fabricated by this process was evaluated without applying resin mold. In detail, the light-emitting element 1 provided with the following configuration was evaluated. It should be noted that the light-emitting element 1 is provided with a structure shown in FIGS. 1A and 1B.

Firstly, the semiconductor laminated structure 10 was composed of the n-type contact layer 101 formed of Si-doped n-type GaAs, the n-type cladding layer 103 formed of Si-doped n-type $(Al_{0.7}Ga_{0.3})_{0.5}In_{0.5}P$, the active layer 105 formed of undoped $(Al_{0.1}Ga_{0.9})_{0.5}In_{0.5}P$, the p-type cladding layer 107 formed of Mg-doped p-type $(Al_{0.7}Ga_{0.3})_{0.5}In_{0.5}P$, and the p-type contact layer 109 formed of Mg-doped p-type GaP.

In addition, a conductive Si substrate was used as the supporting substrate 20, a Ti layer was used as the adhesion layer 206, a Pt layer was used as the barrier layer 204 and an Au layer was used as the joining layer 202. In addition, an Au layer was used for the joining layer 136 of the reflective portion 130, a Ti layer was used for the barrier layer 134, and an Al layer was used for the reflective layer 132. Furthermore, $SiO_2$ was used for the transparent layer 140 and AuZn was used for the contact portion 120. In addition, AuGe, Ti and Au were used for the n-type contact layer 101. The first pad electrode 115a and the second pad electrode 115b are each formed of Ti/Au. In other words, the Ti layer is configured to be in contact with the surface electrode 110. The element size is 300 μm square in top view.

As a result of evaluating the initial characteristic of the light-emitting element 1 provided with the above-mentioned configuration, when 20 mA of current as forward current was supplied to the light-emitting element 1, a forward voltage was 2.05V and a luminous output was 12.5 mW. In addition, after electrically conducting 50 mA of current to the light-emitting element 1 under an environment of 25° C. for 1000 hours, characteristic change was +2.0% in the luminous output and +0.25% in the forward voltage value.

Comparative Example

Figure 3:
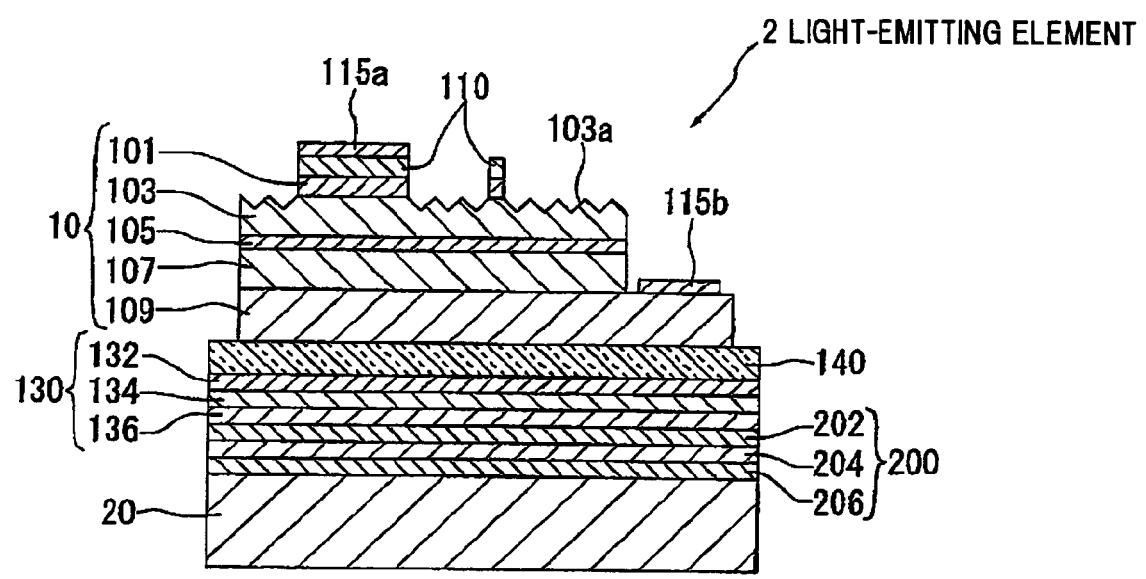
FIG. 3 is a cross sectional view showing a light-emitting element in Comparative Example.

FIG. 3 shows an overview of a cross section of a light-emitting element in Comparative Example.

A light-emitting element 2 in Comparative Example has the same structure as the light-emitting element 1 of the first embodiment, except that the contact portion 120 does not exist and a position to provide the second pad electrode 115b is different. Therefore, a detailed explanation will be omitted except for differences.

Figure 20:
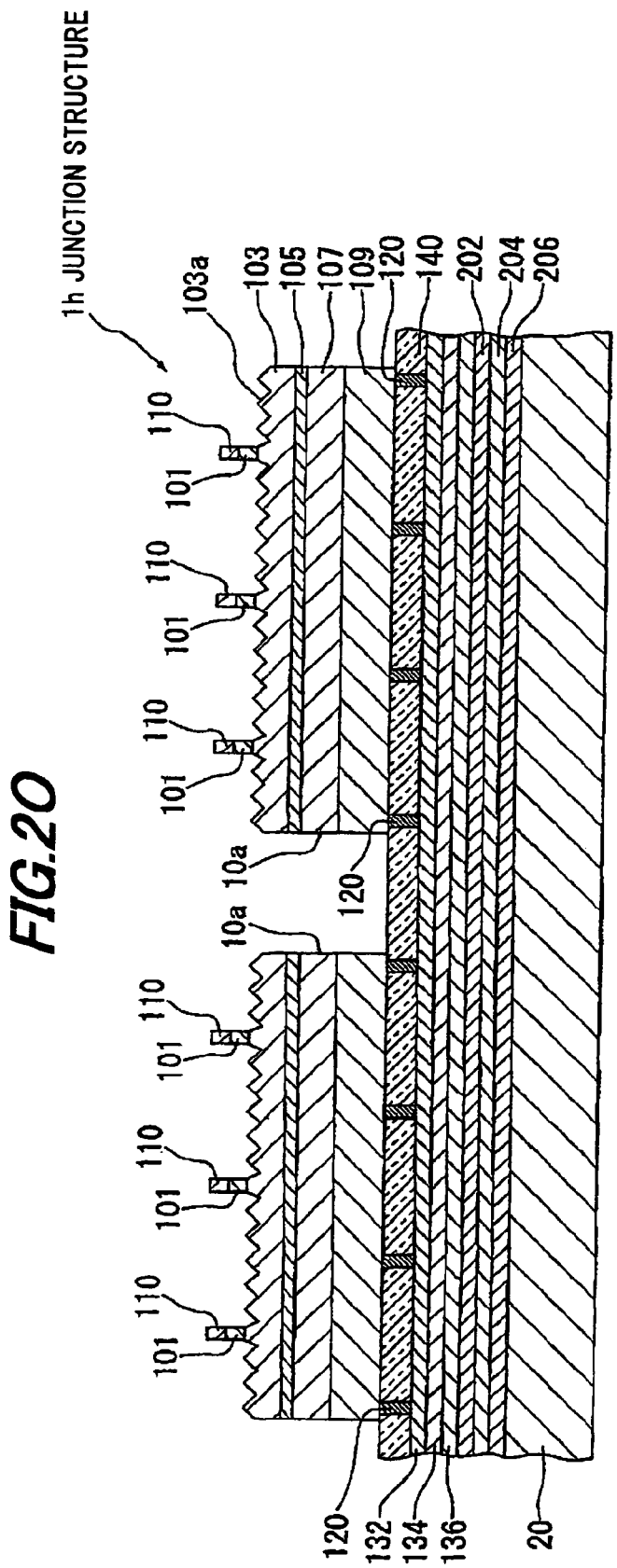

In the light-emitting element 2 in Comparative Example, the transparent layer 140 does not have an opening and the contact portion 120 is not provided. In addition, in the light-emitting element 2, the n-type cladding layer 103 to the p-type cladding layer 107 are removed from the surface side by the wet etching method but the p-type contact layer 109 is not removed in the step of isolating between the light-emitting elements described in FIG. 20 among the fabricating steps of the light-emitting element 1 in the first embodiment of the invention. Then, the second pad electrode 115b is provided in contact with the p-type contact layer 109 in a region where the n-type cladding layer 103 to the p-type cladding layer 107 are removed from the surface side.

The light-emitting element 2 in Comparative Example is die-bonded to the TO-18 stem using a conductive bonding material, and the first pad electrode 115a and the second pad electrode 115b are respectively connected to a predetermined region of the TO-18 stem by a wire such as Au, etc. As a result, it is possible to evaluate characteristics of the light-emitting element 2.

In detail, an initial characteristic of the light-emitting element 2 in Comparative Example was evaluated without applying resin mold. As a result, when 20 mA of current as forward current was supplied to the light-emitting element 2, forward voltage was 2.25V and a luminous output was 8.7 mW. In addition, after electrically conducting 50 mA of current to the light-emitting element 2 under an environment of 25° C. for 1000 hours, characteristic change was +1.8% in the luminous output and +0.22% in the forward voltage.

The result was that the light-emitting element 2 in Comparative Example is lower in the luminous output and higher in the forward voltage compared with the light-emitting element 1 in the first embodiment.

Effects of the First Embodiment

In the light-emitting element 1 of the present embodiment, since the second pad electrode 115b is directly in contact with the contact portion 120 formed of a metal material, current fed to the second pad electrode 115b is fed to the p-type contact layer 109 through the contact portion 120 (i.e., the linear portions 120a to 120e) in the state that current loss between the second pad electrode 115b and the contact portion 120 does not substantially occur. In addition, in the present embodiment, the contact portion 120 (i.e., the linear portions 120a to 120e) is shaped or positioned such that current is substantially uniformly supplied to the substantially whole surface of the p-type contact layer 109. Thus, since current supplied to the light-emitting element 1 can be substantially uniformly dispersed in the plane of the p-type contact layer 109, the dispersed current can be substantially uniformly dispersed in the plane of the active layer 105. Here, although the contact portion 120 (i.e., the linear portions 120a to 120e) itself does not serve to disperse current in the plane of the p-type contact layer 109, it is positioned such that current can be uniformly dispersed to the regions except directly under the surface electrode 110 without being concentrated at specific region of the surface electrode 110 or the contact portion 120. As a result, according to the present embodiment, it is possible to obtain a high-intensity light-emitting element 1. Particularly, the effect of uniformly dispersing and supplying current to the active layer 105 is significant when large current is fed to the light-emitting element 1.

Second Embodiment

FIG. 4 shows an overview of a cross section of a light-emitting element in the second embodiment.

A light-emitting element 3 in the second embodiment of the invention has the substantially same structure as the light-emitting element 1 of the first embodiment of the invention, except that the second pad electrode 115b is provided directly on the reflective layer 132. Therefore, a detailed explanation will be omitted except differences.

In the light-emitting element 3 of the second embodiment, the transparent layer 140 and the contact portion 120 are not provided on the reflective layer 132 which corresponds to a region where the semiconductor laminated structure 10 is removed. In other words, the second pad electrode 115b is provided directly in contact with a surface of the reflective layer 132 exposed by removing the semiconductor laminated structure 10 and the transparent layer 140 corresponding to a region where the second pad electrode 115b is provided.

For example, the light-emitting element 3 is fabricated as follows. Firstly, the n-type cladding layer 103 to the p-type contact layer 109 are removed from the surface side in the step of isolating between the light-emitting elements described in FIG. 2O among the fabricating steps of the light-emitting element 1 in the first embodiment of the invention. Furthermore, the transparent layer 140 and the contact portion 120, which correspond to a portion where the n-type cladding layer 103 to the p-type contact layer 109 are removed, are removed. And then, the second pad electrode 115b is formed on the surface of the reflective layer 132 exposed by removing the transparent layer 140 and the contact portion 120, thereby fabricating the light-emitting element 3. As a result, in the light-emitting element 3 of the second embodiment, the current supplied to the second pad electrode 115b is supplied to the contact portion 120 via the reflective layer 132 formed of a metal material.

The light-emitting element 3 of the second embodiment is die-bonded to the TO-18 stem using a conductive bonding material, and the first pad electrode 115a and the second pad electrode 115b are respectively connected to a predetermined region of the TO-18 stem by a wire such as Au, etc. As a result, it is possible to evaluate characteristics of the light-emitting element 3.

In detail, an initial characteristic of the light-emitting element 3 of the second embodiment was evaluated without applying resin mold. As a result, when 20 mA of current as forward current was supplied to the light-emitting element 3, forward voltage was 2.02V and a luminous output was 12.3 mW. In addition, after electrically conducting 50 mA of current to the light-emitting element 3 under an environment of 25° C. for 1000 hours, characteristic change was +1.6% in the luminous output and +0.28% in the forward voltage value. As a result, it was shown that the light-emitting element 3 in the second embodiment has the characteristics equivalent to the light-emitting element 1 in the first embodiment.

Third Embodiment

A light-emitting element in a third embodiment has the same structure as the light-emitting element 3 of the second embodiment, except that the element size is different. Therefore, a detailed explanation will be omitted except differences.

In detail, the light-emitting element in the third embodiment is formed in 1000 μm square (1 mm square) in top view. In addition, the light-emitting element in the third embodiment is die-bonded to the TO-46 stem using a conductive bonding material, and the first pad electrode 115a and the second pad electrode 115b are respectively connected to a predetermined region of the TO-46 stem by a wire such as Au, etc. As a result, it is possible to evaluate characteristics of the light-emitting element in the third embodiment.

In detail, an initial characteristic of the light-emitting element in the third embodiment was evaluated without applying resin mold. As a result, when 1000 mA of current as forward current was supplied to the light-emitting element in the third embodiment, forward voltage was 2.82V and a luminous output was 598 mW. In addition, after electrically conducting 1000 mA of current to the light-emitting element under an environment of 25° C. for 1000 hours, characteristic change was +1.6% in the luminous output and +0.28% in the forward voltage value.

In addition, as a light-emitting element in Comparative Example of the light-emitting element in the third embodiment, a light-emitting element provided with the configuration shown in FIG. 3 and having a chip size of 1000 μm was fabricated.

The light-emitting element in the third embodiment is die-bonded to the TO-46 stem using a conductive bonding material, the first pad electrode 115a and the second pad electrode 115b are respectively connected to a predetermined region of the TO-46 stem by a wire such as Au, etc., and the characteristics of the light-emitting element was evaluated.

In detail, an initial characteristic of the light-emitting element in Comparative Example of the light-emitting element in the third embodiment was evaluated without applying resin mold. As a result, when 1000 mA of current as forward current was supplied to the light-emitting element, forward voltage was 3.22V and a luminous output was 465 mW. In addition, after electrically conducting 1000 mA of current to the light-emitting element under an environment of 25° C. for 1000 hours, characteristic change was −15.0% in the luminous output and +2.308% in the forward voltage value.

From the above, in the light-emitting element in the third embodiment in which the element size is increased, it was shown that a light-emitting element with high luminous output as well as with high reliability is obtained.

Although the embodiments of the invention has been described, the invention according to claims is not to be limited to the above-mentioned embodiments and example. Further, please note that not all combinations of the features described in the embodiments and example are not necessary to solve the problem of the invention.

What is claimed is:

1. A light-emitting element, comprising:
    a semiconductor laminated structure comprising a first semiconductor layer of a first conductivity type, a second semiconductor layer of a second conductivity type different from the first conductivity type and an active layer sandwiched by the first and second semiconductor layers;
    a first electrode on one surface side of the semiconductor laminated structure;
    a conductive reflective layer on an other surface side of the semiconductor laminated structure for reflecting light emitted from the active layer;
    a contact portion partially formed between the semiconductor laminated structure and the conductive reflective layer and being in ohmic contact with the semiconductor laminated structure;
    a second electrode on a part of a surface of the conductive reflective layer on the semiconductor laminated structure without contacting the semiconductor laminated structure for feeding current through the conductive reflective layer to the contact portion;
    a supporting substrate on which the conductive reflective layer is formed; and
    a transparent layer formed between the semiconductor laminated structure and the conductive reflective layer and comprising an opening,
    wherein the opening is formed on the transparent layer except directly under the first electrode,
    the contact portion is formed in the opening,
    the semiconductor laminated structure is supported by the supporting substrate via the transparent layer, the transparent layer comprises one selected from SiO$_2$, SiN and ITO, the semiconductor laminated structure is partially removed from the one surface to the other surface, a part of the opening is formed on the conductive reflective layer corresponding to a region that the semiconductor laminated structure is partially removed, and the second electrode is in contact with the contact portion formed in the part of the opening.

2. A light-emitting element, comprising:

a semiconductor laminated structure comprising a first semiconductor layer of a first conductivity type, a second semiconductor layer of a second conductivity type different from the first conductivity type and an active layer sandwiched by the first and second semiconductor layers;

a first electrode on one surface side of the semiconductor laminated structure;

a conductive reflective layer on an other surface side of the semiconductor laminated structure for reflecting light emitted from the active layer;

a contact portion partially formed between the semiconductor laminated structure and the conductive reflective layer and being in ohmic contact with the semiconductor laminated structure;

a second electrode on a part of a surface of the conductive reflective layer on the semiconductor laminated structure without contacting the semiconductor laminated structure for feeding current through the conductive reflective layer to the contact portion;

a supporting substrate on which the conductive reflective layer is formed; and a transparent layer formed between the semiconductor laminated structure and the conductive reflective layer and comprising an opening, wherein the opening is formed on the transparent layer except directly under the first electrode, the contact portion is formed in the opening, the semiconductor laminated structure is supported by the supporting substrate via the transparent layer, the transparent layer comprises one selected from SiO$_2$, SiN and ITO, the semiconductor laminated structure is partially removed from the one surface to the other surface, the transparent layer is not formed on the conductive reflective layer corresponding to a region that the semiconductor laminated structure is partially removed, and the second electrode is in contact with the conductive reflective layer corresponding to a region that the transparent layer is not formed.

* * * * *